United States Patent [19]

Wociechowski et al.

[11] Patent Number: 5,495,453
[45] Date of Patent: Feb. 27, 1996

[54] LOW POWER VOLTAGE DETECTOR CIRCUIT INCLUDING A FLASH MEMORY CELL

[75] Inventors: Kenneth E. Wociechowski, Folsom; Mase J. Taub, Elk Grove, both of Calif.

[73] Assignee: Intel Corporation, Santa Clara, Calif.

[21] Appl. No.: 326,689

[22] Filed: Oct. 19, 1994

[51] Int. Cl.$^6$ ..................................................... G11C 7/00
[52] U.S. Cl. .................. 365/185.18; 365/185.26; 365/189.09; 365/227; 365/226; 365/185.23
[58] Field of Search .............................. 365/189.09, 226, 365/227, 185, 228, 229

[56] References Cited

U.S. PATENT DOCUMENTS

| | | | |
|---|---|---|---|
| 4,975,883 | 12/1990 | Baker et al. | 365/226 |
| 5,276,646 | 1/1994 | Kim et al. | 365/189.09 |
| 5,301,161 | 4/1994 | Landgraf et al. | 365/229 |
| 5,303,189 | 4/1994 | Devin | 365/185 X |
| 5,339,272 | 8/1994 | Tedrow et al. | 365/189.09 |
| 5,394,359 | 2/1995 | Kowalski | 365/185 |

*Primary Examiner*—David C. Nelms
*Assistant Examiner*—Son Mai
*Attorney, Agent, or Firm*—Blakely, Sokoloff, Taylor & Zafman

[57] ABSTRACT

A voltage detector circuit for detecting when an input voltage exceeds a trip-point voltage. The voltage detector circuit includes a nonvolatile memory cell having a select gate coupled to the input voltage, a drain coupled to a first node, a source coupled to system ground, and a floating gate. The nonvolatile memory cell is used primarily as a pull-down transistor, and the threshold voltage of nonvolatile memory is programmed to be the trip-point voltage such that the first node is set to system ground if the input voltage exceeds the trip-point voltage. The voltage detector circuit also includes a first transistor having a control electrode coupled to a biasing voltage, a first terminal coupled to the first node, and a second terminal coupled to a supply voltage. The control electrode is operative to couple the first terminal to the second terminal in response to the biasing voltage. The first transistor sets the first node to the input voltage if the input voltage is less than the trip-point voltage. The voltage detector further includes an output circuit coupled to the first node. The output circuit is operative to indicate whether the input voltage exceeds the trip-point voltage in response to the voltage of the first node.

11 Claims, 24 Drawing Sheets

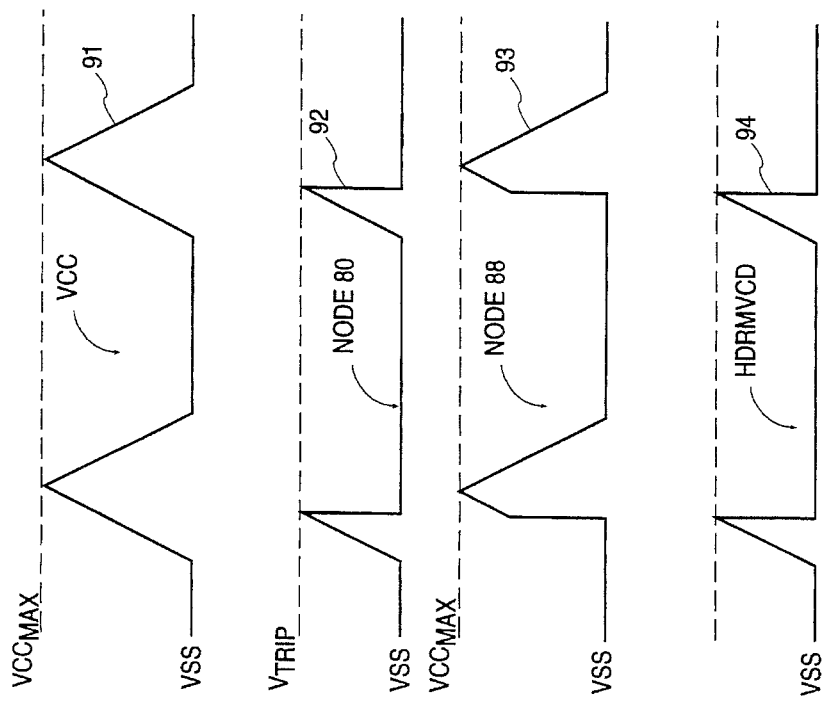
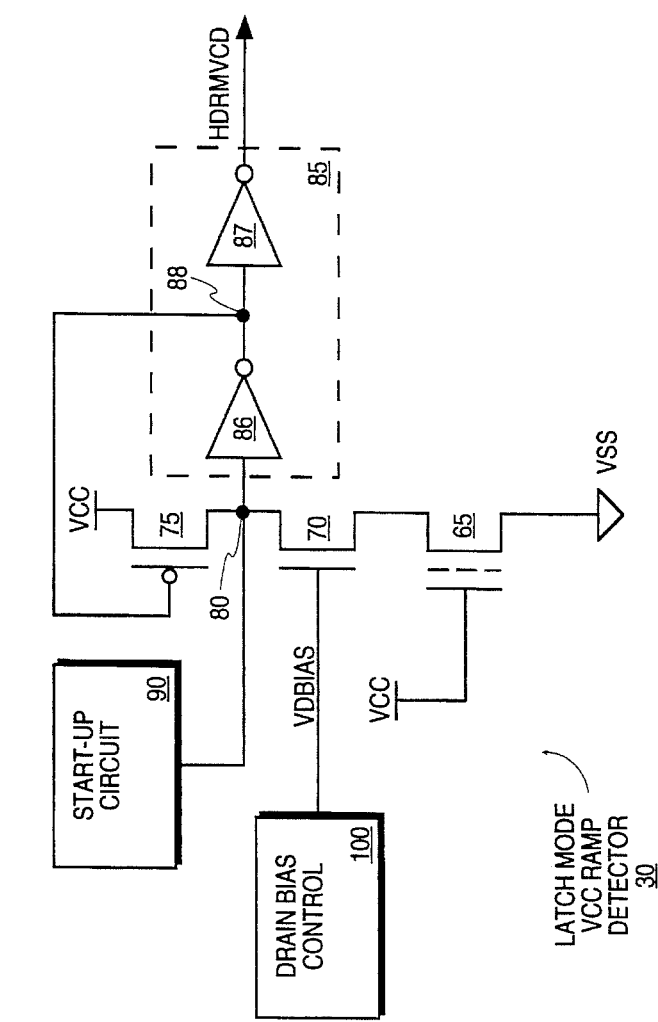
FIG. 4
FIG. 5

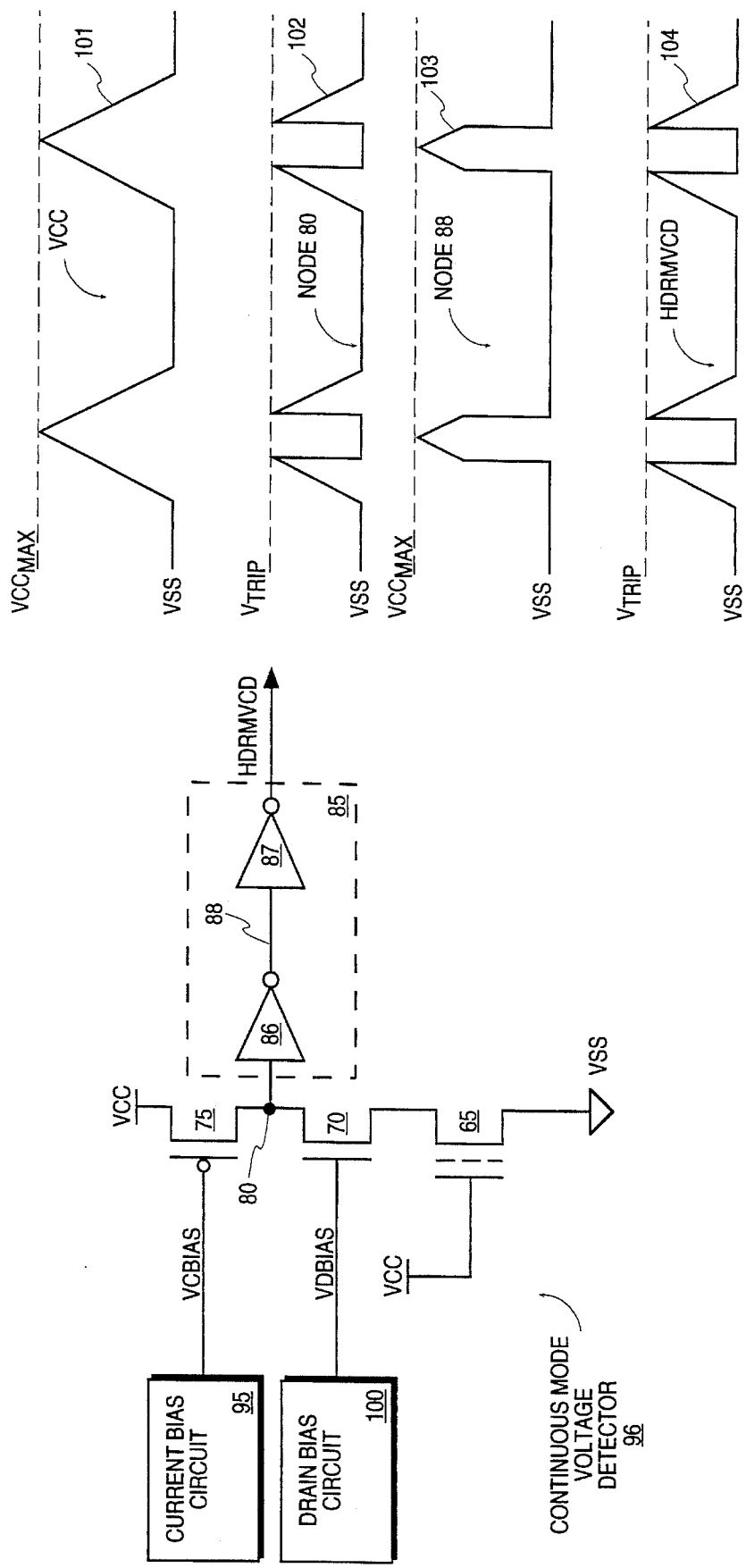

LOW POWER VOLTAGE DETECTOR CIRCUIT INCLUDING A FLASH MEMORY CELL

FIELD OF THE INVENTION

The present invention relates generally to power management of integrated circuits and more particularly to the power management of nonvolatile memory devices.

BACKGROUND

The use of computer systems has grown so pervasive that the power consumed by computer systems has become a concern for computer system designers and consumers. To reduce the cost of providing power to operate computer systems and the corresponding consumption of energy resources, the goal of designing a "green PC" that consumes less power has been pursued by several manufacturers. Manufacturers of mobile or "portable" computer systems that operate using rechargeable batteries as power supplies have also attempted to reduce power consumption so that the mobile computer system may be used for extended periods of time without recharging the batteries.

To reduce power consumption and to extend battery life, much of the integrated circuitry used as components of computer systems being desired to operate at low voltage levels. For example, the circuitry and components used in portable computers are being designed to operate exclusively at voltage levels such as five volts and 3.3 volts. This reduces power consumption and allows more components to be placed closer to one another in the circuitry.

Unfortunately, the movement towards reducing the power consumption of computer systems may conflict with the desire to provide after-market upgrades and add-on devices for portable computer systems. One type of device that may be used to increase the versatility of a portable computer system is the flash electrically erasable programmable read only memory ("flash EEPROM"). Flash EEPROMs are nonvolatile memory devices that can be programmed and erased by the user, and flash EEPROMS may be used, for example, as BIOS ROMs or as part of a plug-in memory card. Flash EEPROMs typically require higher voltages for programming and erasing data than can be provided directly by the reduced voltage power supplies of green PCs and portable computers.

One solution for allowing flash EEPROMs to be used in reduced voltage computer system designs is to provide charge pump circuits external to the flash EEPROMs for boosting the supply voltage levels of the computer system to the higher voltage levels required by the flash EEPROM. A difficulty with this solution is that the use of separate charge pump circuits requires printed circuit board space that may be at a premium in a portable computer system.

An alternative solution is to design flash EEPROMs that include charge pump circuits for internally generating the higher voltage levels required by the flash EEPROM. One difficulty with this solution is that charge pumps internal to the flash EEPROM require semiconductor die space, which may require an increase in the semiconductor die size for the flash EEPROM. Another difficulty is that internal charge pump circuits may not be able to provide sufficient current to program and erase the memory cell array as quickly as external charge pumps, and operation of the flash EEPROM may be slowed.

SUMMARY AND OBJECTS OF THE INVENTION

Therefore, one object of the present invention to provide circuitry for detecting the external supply voltages supplied to an integrated circuit.

A further object of the present invention is to provide circuitry for detecting the external supply voltages that operates at a reduced power consumption level.

Another object of the present invention is to provide circuitry for detecting the external supply voltages that requires a reduced amount of semiconductor die space.

These and other objects of the invention are provide by a voltage detector circuit for detecting when an input voltage exceeds a trip-point voltage. The voltage detector circuit includes a nonvolatile memory cell having a select gate coupled to the input voltage, a drain coupled to a first node, a source coupled to system ground, and a floating gate. The nonvolatile memory cell is used primarily as a pull-down transistor, and the threshold voltage of nonvolatile memory is programmed to be the trip-point voltage such that the first node is set to system ground if the input voltage exceeds the trip-point voltage. The voltage detector circuit also includes a first transistor having a control electrode coupled to a biasing voltage, a first terminal coupled to the first node, and a second terminal coupled to a supply voltage. The control electrode is operative to couple the first terminal to the second terminal in response to the biasing voltage. The first transistor sets the first node to the input voltage if the input voltage is less than the trip-point voltage. The voltage detector further includes an output circuit coupled to the first node. The output circuit is operative to indicate whether the input voltage exceeds the trip-point voltage in response to the voltage of the first node.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which:

FIG. 4 shows a latch mode VCC detector.

FIG. 5 shows the behavior of the latch mode VCC detector.

FIG. 6 shows a continuous mode VCC detector.

FIG. 7 shows the behavior of the continuous mode VCC detector.

DETAILED DESCRIPTION

Figure 1:
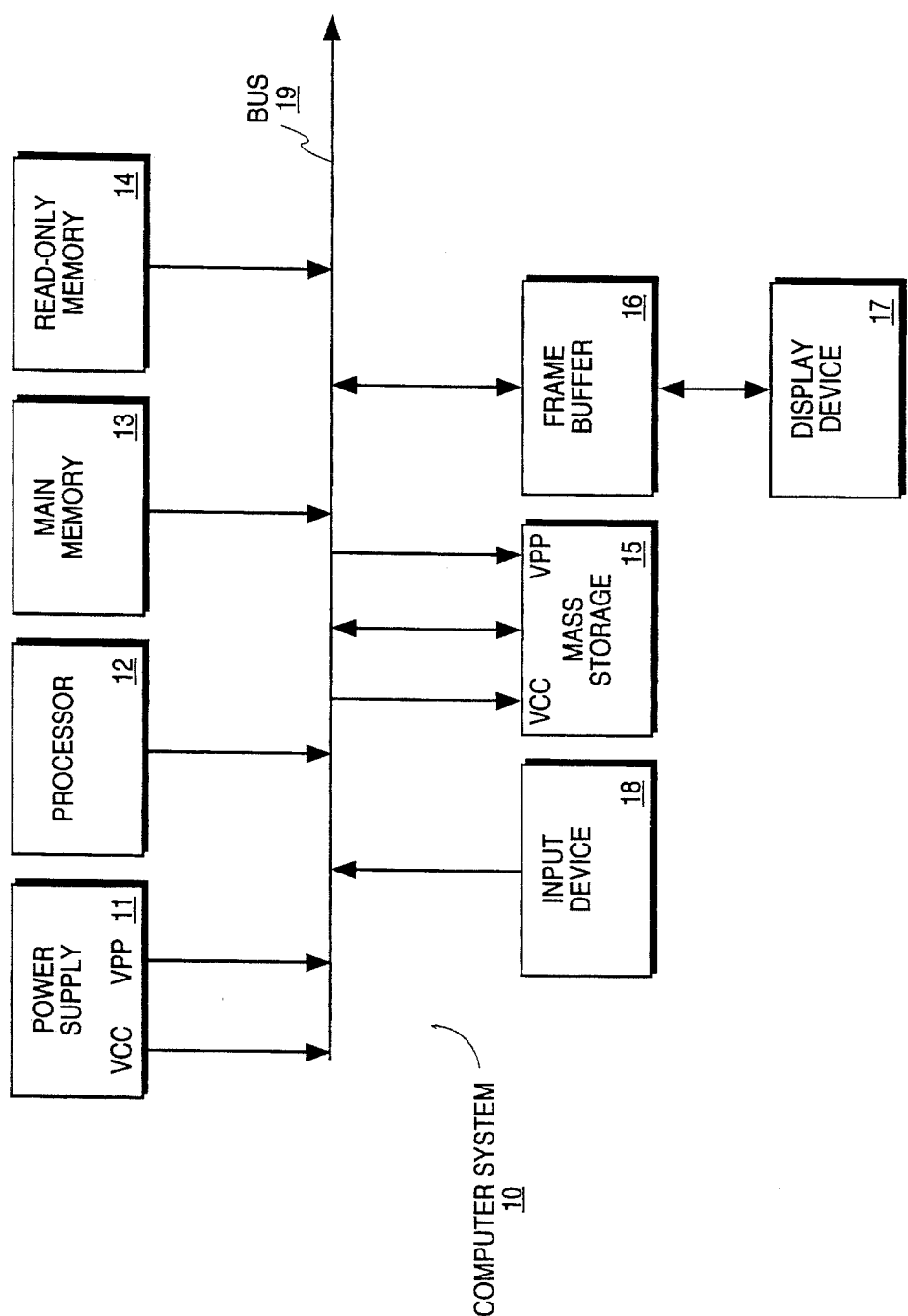
FIG. 1 shows a computer system that includes one or more components having novel circuitry.

FIG. 1 shows a general purpose computer system 10 that includes a power supply 11, a central processing unit ("CPU") 12, a main memory 13, a read only memory 14, a mass storage device 15, a frame buffer 16, and an input device 18, all of which are coupled to a bus 19. The bus 19 includes a data bus and acts as a primary interconnect for the components of the computer system 10 so that data may be transferred among the various components. The computer system 10 also includes a display device 17 that is coupled to the frame buffer 16 for receiving image data for display. The read only memory 14 may be a flash EEPROM, and the mass storage device may be a "solid state disk drive" that includes a plurality of flash EEPROMs for emulating the operation of a magnetic hard disk drive.

The computer system 10 may be a portable computer, a workstation, a minicomputer, a programmable digital assistant ("PDA"), a mainframe, or any other type of computer, and the power requirements of the computer system 10 are defined accordingly. For example, if the computer system 10 is a workstation, the system operating voltage VCC may be 5.0 volts, wherein if the computer system 10 is a portable computer operating from a rechargeable battery, the system operating voltage VCC may be 3.3 volts. It may also be possible that the computer system 10 is a portable computer system that provides different operating voltage levels depending on whether power is supplied by the rechargeable battery or by an AC adapter.

The power supply 11 therefore includes a VCC supply output for supplying the operating voltage VCC of the computer system 10 to the components of the computer system via power conductors of the bus 19. Wherein the computer system 10 is a portable computer, the power supply 11 may be a rechargeable battery. The power supply 11 may also include a VPP supply output for supplying a twelve volt programming voltage VPP to the read only memory 14 or the mass storage device 15. If the power supply 11 does not include a separate VPP supply output, the VPP input of flash EEPROMs included in the computer system 10 may be coupled to receive the VCC operating voltage.

The flash EEPROMs of the computer system 10 includes circuitry that allows the flash EEPROMs to operate when VCC is equal to 3.3 volts or 5.0 volts and VPP is equal to 5.0 volts or 12.0 volts. Each flash EEPROM therefore includes circuitry for detecting the supply voltages supplied by the power supply 11, wherein each flash EEPROM configures itself for operation in response to the detected voltages. Not all the flash EEPROMs of the computer system 10 need to include such circuitry.

Figure 2:
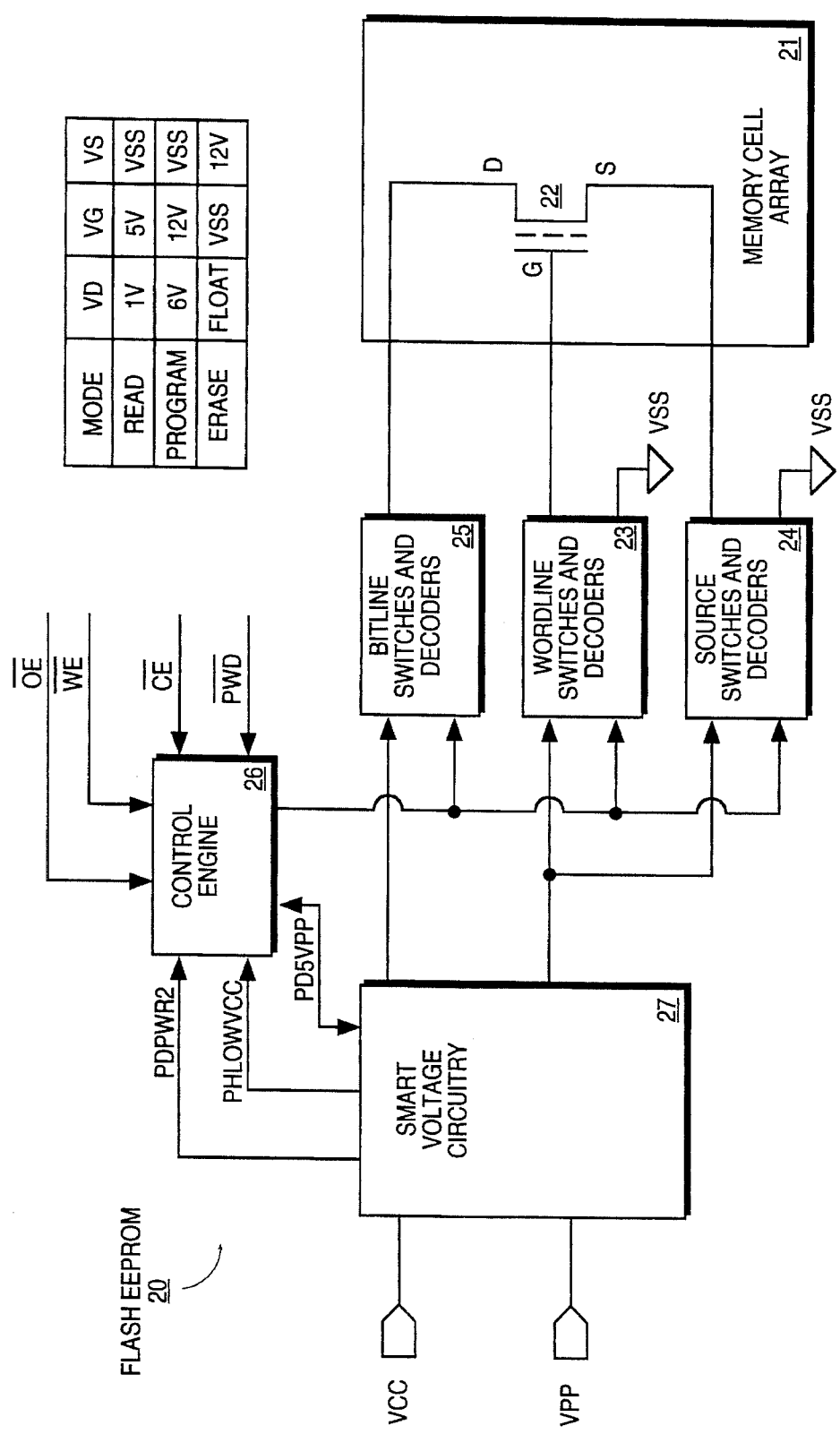
FIG. 2 shows a flash EEPROM that includes novel circuitry.

FIG. 2 shows a flash EEPROM that includes circuitry for detecting system supply voltages. The flash EEPROM 20 is an integrated circuit that may be formed on a single semiconductor substrate and that typically includes a memory cell array 21 comprising a plurality of flash memory cells 22, each of which is a floating gate transistor device having a select gate, a floating gate, a drain, and a source. The flash memory cells 22 of the memory cell array 21 are arranged in a matrix of rows and columns, wherein a common "wordline" is coupled to the select gate of each flash memory cell of a row and a common "bitline" is coupled to the drain of each flash memory cell of a column.

A flash memory cell 22 is programmed by placing excess charge on the floating gate, which increases the threshold voltage $V_t$ of the flash memory cell 22. The flash memory cell 22 may be placed in two or more analog states that can be represented by one or more bits. Programming may be accomplished by applying 12.0 volts to the gate, 6.0 volts to the drain, and grounding the source such that electrons are placed on the floating gate by hot electron injection. The flash memory cell 22 is erased by removing the excess charge from the floating gate, and erasure may be accomplished by applying 12.0 volts to the source, grounding the gate, and allowing the drain to float such that electrons are removed from the floating gate via electron tunneling. It is possible to erase several flash memory cells simultaneously, and the operation of erasing several flash memory cells simultaneously is known as a "block erase."

To determine whether the flash memory cell 22 is in the erased state or in a programmed state, a constant voltage is applied to the select gate of the flash memory cell to sense the amount of drain-source current $I_{DS}$ for the flash memory cell 22. Such a read operation may be accomplished by applying 5.0 volts to the gate, grounding the source, and applying 1.0 volt to the drain. To perform read, program, and erase operations on a selected set of flash memory cells, the flash EEPROM 20 includes wordline switches and decoders 23, source switches and decoders 24, and bitline switches and decoders 25, all of which are controlled by the control engine 26 to select the desired flash memory cells and to apply the appropriate voltages to the selected flash memory cells. The smart voltage circuitry 27 is coupled to the VCC and VPP input pins of the flash EEPROM 20 and is used to supply the required voltages to the wordline switches and decoders 23, the source switches and decoders 24, and the bitline switches and decoders 25 in response to the detected supply levels and the mode of operation for the flash EEPROM 20.

The smart voltage circuitry 27 includes internal power supplies (shown in FIGS. 3A and 3B) that may be selected to supply the necessary voltages for operating the flash EEPROM if the external supply levels are determined to be less than the required values for programming, erasing, or reading the memory cell array 21. For example, an internal power supply may be enabled to supply a 5.0 volt output if the external operating supply voltage VCC is detected to be at 3.3 volts, but if the external operating supply voltage VCC is detected to be at 5.0 volts, the internal power supply is disabled and the external operating supply voltage VCC is delivered to the memory cell array 21. Similarly, an internal power supply may be enabled during programming and erase operations to supply a 12.0 volt output if the external programming supply voltage VPP is detected to be at 5.0 volts, but if the external programming supply voltage VPP is detected to be at 2.0 volts the internal power supply is disabled and the external programming supply voltage VPP is delivered to the memory cell array.

The smart voltage circuitry 27 thus allows the same flash EEPROM 20 to be used in computer systems that operate at either high or low voltages. Wherein printed circuit board space is at a premium, the system designer can use the internal power supplies of the flash EEPROM 20 to provide the voltages required for programming and erasing, and an external charge pump circuit is not required. Alternatively, wherein memory performance is at a premium, the system designer can use a power supply or external charge pump circuit to provide the programming and erase voltages.

The smart voltage circuitry 27 may find application for many different types of integrated circuits and more particularly memory devices. For example, the smart voltage circuitry described herein may be used in dynamic random access memories (DRAMs), eraseable programmable read only memories (EPROMs), and electrically eraseable programmable read only memories (E$^2$PROMs). The smart voltage circuitry 27 may also be used to detect and select the voltages for the different modules of a multi-chip module. The internal power supplies may be provided as one module, and the voltage detection and selection circuitry may be provided as a second module. The voltage detection and selection circuitry can be used to detect the external power supply voltages and selectively enable the appropriate outputs of the internal power supplies, if necessary.

The flash EEPROM 20 has three modes of operation, including an active mode, a stand-by mode, and a deep power down mode. The stand-by and deep power down modes are both reduced power modes. To define the mode of operation of the flash EEPROM 20, the control engine 26 receives the control signals chip enable $\overline{CE}$, output enable $\overline{OE}$, write enable $\overline{WE}$, and power down $\overline{PWD}$. Chip enable signal $\overline{CE}$ is the power control and is used for device selection of the flash EEPROM 20. The output enable signal $\overline{OE}$ is the output control for flash EEPROM 20 and is used to gate data from the output pins from flash EEPROM 20, dependent on device selection. Both of the control signals $\overline{CE}$ and $\overline{OE}$ must be at a logic low level to obtain data at the outputs of flash EEPROM 20. The write enable signal WE allows writes to control engine 26 while the chip enable signal $\overline{CE}$ is active low. Addresses and data are latched on the rising edge of the write enable signal $\overline{WE}$.

The flash EEPROM 20 is in the active mode of operation when both control signals $\overline{CE}$ and $\overline{OE}$ are at a logic low level and $\overline{PWD}$ is at a logic high level. When both the chip enable signal $\overline{CE}$ and the power down signal $\overline{PWD}$ are logic high, the flash EEPROM 20 enters the stand-by mode. The power down signal $\overline{PWD}$ causes the flash EEPROM 20 to enter the deep power down mode when the power down signal PWD is at a logic low level.

For the active mode of operation, the flash EEPROM 20 may draw sufficient power from the power supply 11 to perform read, program, and erase operations. For the stand-by mode of operation, the flash EEPROM 20 is prevented from performing any operations on the memory cell array 21, and the amount of power that the flash EEPROM 20 may consume is reduced. For the deep power down mode of operation, all memory cell array operations are disabled and the amount of power that the flash EEPROM 20 may consume is less than that of the stand-by mode. For example, the flash EEPROM 20 may consume 100 microamperes of current while in the stand-by mode and only two microamperes of current while in the deep power down mode. For prior flash EEPROMs that do not include internal power supplies, the deep power down mode results in the disabling of all the circuits of the flash EEPROM.

When the flash EEPROM 20 transitions from either the stand-by mode or the deep power down mode to the active mode, it is desirable for the flash memory cell array 21 be ready to perform for read operations, which means that the wordline switches 23 should be charged to 5.0 volts. If the detected external supply voltage VCC is 5.0 volts, the wordline switches may be maintained at 5.0 volts by the external supply voltage VCC during the stand-by and deep power down modes through the use of a simple pull-up device, which may be a transistor or a resistor. If the detected external supply voltage is VCC 3.3 volts, an internal power supply may be used to charge the wordline switches 23 to 5.0 volts.

If the external supply voltage VCC is equal to 3.3 volts and the internal power supplies are only enabled to charge wordline switches 23 when the flash EEPROM 20 operates in the active mode, the access time for the flash EEPROM 20 is increased when the flash EEPROM transitions from the stand-by or deep power down modes to the active mode to allow the wordline switches 23 to be charged to the appropriate voltage. The wordline switches 23 are discharged due to leakage, and, given sufficient amount of time, the wordlines switches 23 may be discharged to the value of the external supply voltage VCC. Further, wherein the memory cell array 21 is quite large, the capacitance of the wordline switches 23 is increased, which may result in significant voltage and current transients internal to the flash EEPROM 20 when the flash EEPROM 20 transitions between operating modes. Such transients must be accounted for, which typically results in a further increase in access time. Therefore, to decrease the amount of time required to access the flash EEPROM 20 and to reduce internal transients, it may be desirable for the appropriate internal power supply to remain in operation during the stand-by and deep power down modes; however, the design of the smart voltage circuitry may be constrained by the power consumption requirements of the flash EEPROM and by the amount of semiconductor die space that can be provided for the smart voltage circuitry.

Figure 3A:
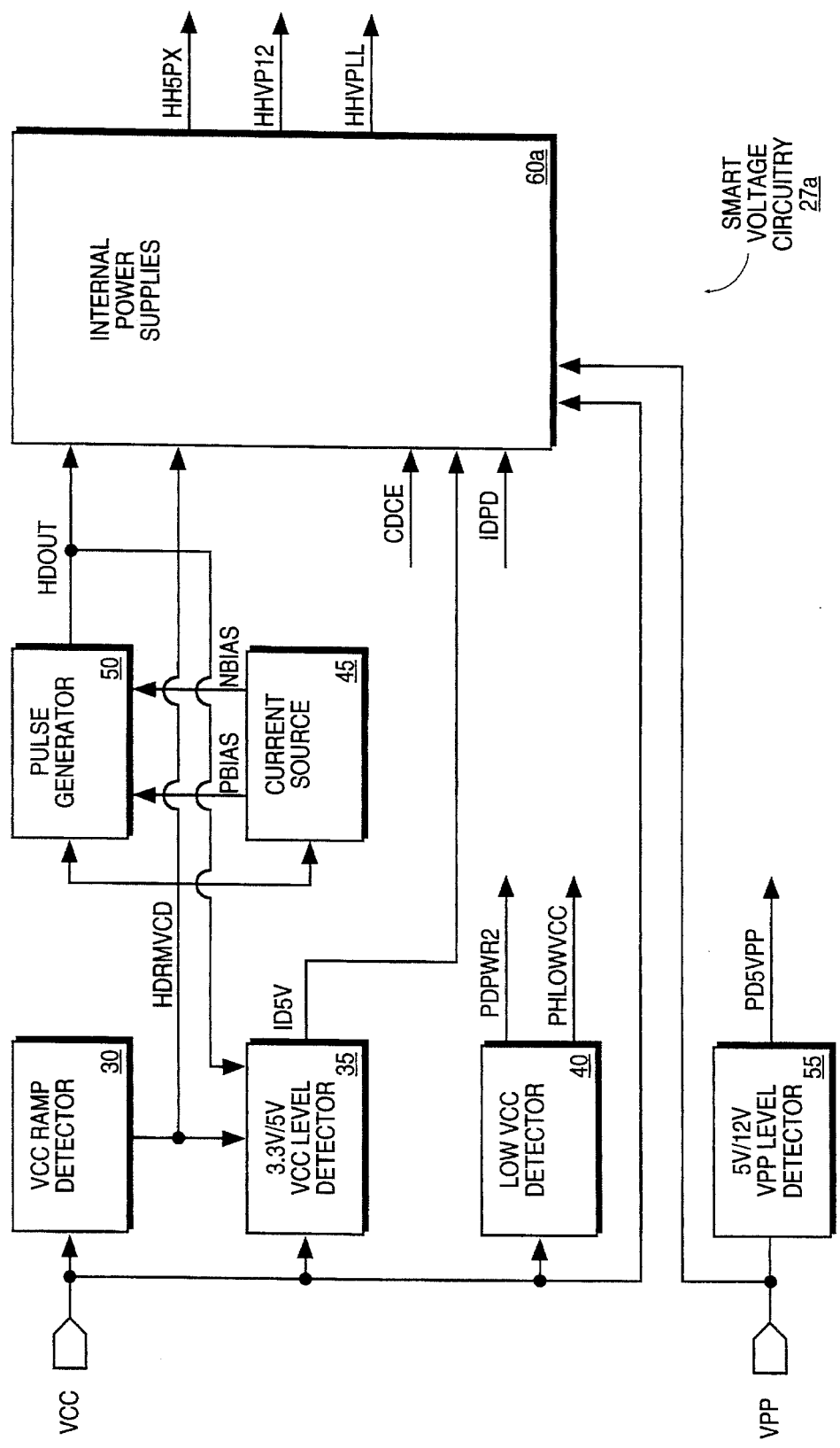
FIGS. 3A and 3B show smart voltage circuitry of the flash EEPROM according to different embodiments.
Figure 3B:
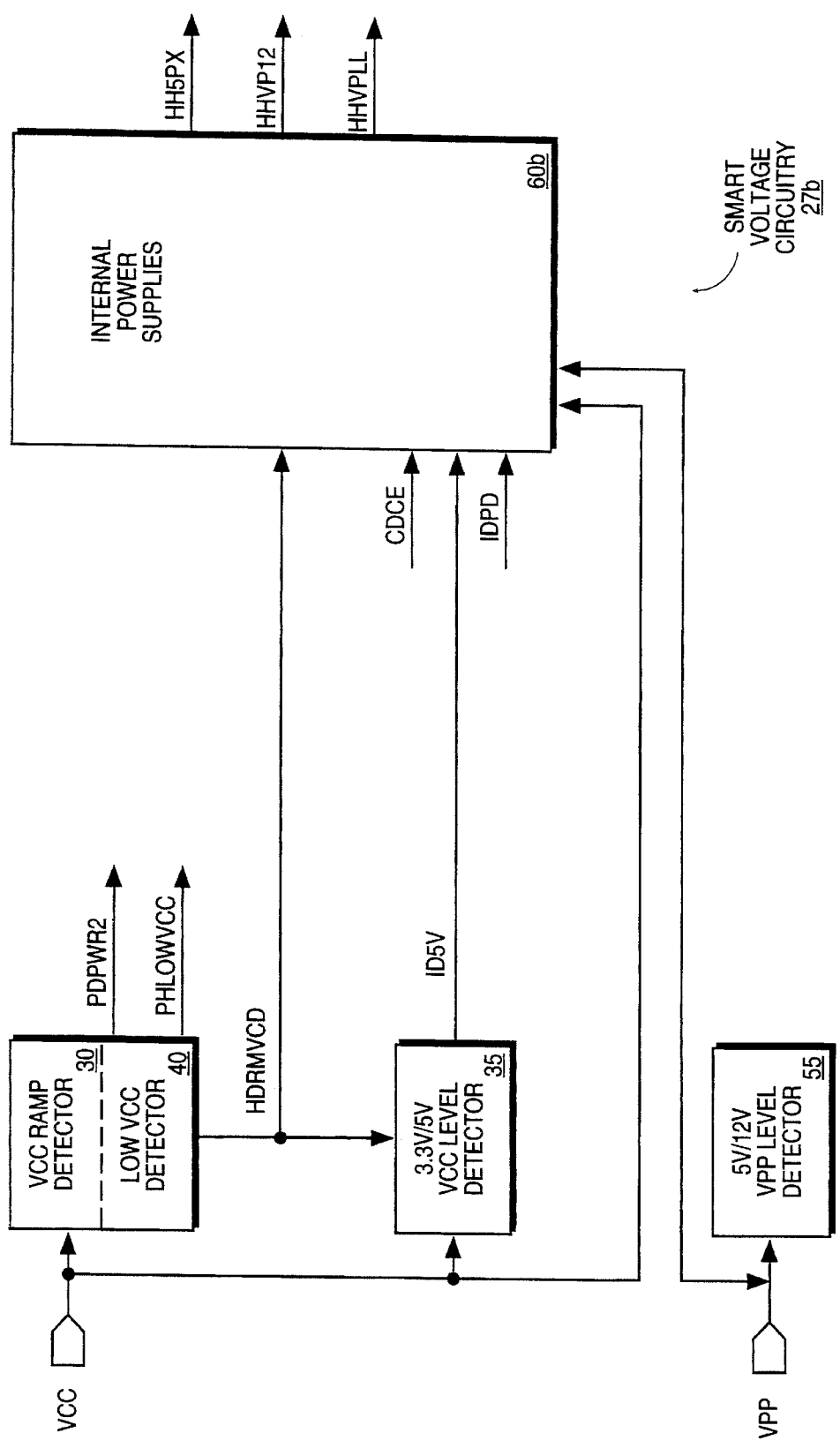

FIGS. 3A and 3B show the smart voltage circuitry 27 according to two different embodiments. FIG. 3A shows an example of the smart voltage circuitry 27a wherein the wordline switches 23 are maintained at 5.0 volts by the internal power supplies while the flash EEPROM 20 is operating in both the stand-by and deep power down modes. The smart voltage circuitry 27a of FIG. 3A results in a greatly reduced access time, but may require more die space. Figure FIG. 3B shows an example of the smart voltage circuitry 27b wherein the wordline switches 23 are maintained at 5.0 volts by the internal power supplies during the stand-by mode, but are maintained at the external supply voltage VCC during the deep power down mode. The smart voltage circuitry 27b of FIG. 3B typically requires less die space than the circuitry of FIG. 3A, but access time may be increased.

FIG. 3A shows smart voltage circuitry 27a that includes a VCC ramp detector 30, a 3.3 v/5 v VCC level detector 35, a low VCC detector 40, a current source 45, a pulse generator 50, a 5 v/12 v VPP level detector 55, and internal power supplies 60a. The operation of the internal power supplies 60a is determined by the mode of operation for flash EEPROM 20, the external operating supply voltage VCC, and the external programming supply voltage VPP as detected by the VCC ramp detector 30, the 3.3 v/5 v VCC level detector 35, and the 5 v/12 v VPP level detector 55. The program and erase operations are inhibited if a low external supply voltage VCC level is detected by the low VCC level detector 40 while the flash EEPROM 20 is in the active mode of operation. The current source 45 and the pulse generator 50 are included to conditionally and periodically enable the internal power supplies 60a for charging the wordline switches 23 to 5.0 volts while the flash EEPROM operates in either the stand-by or deep power down operating modes. The wordline switches 23 are thus maintained at the requisite voltage level, but the internal power supplies are only periodically activated such that the power consumption of the flash EEPROM 20 may be maintained within the limits defined for the stand-by and deep power down modes of operation. This circuitry is described in more detail below.

The internal power supplies 60a include three output lines. The HH5PX output line may be coupled to the wordline switches 23 for read operations. The HHVPLL output line may be coupled to the bitline switches 25 for programming operations. The HHVP12 output line may be coupled to the wordline switches 23 for programming operations and to the source switches 24 for erase operations.

FIG. 3B shows smart voltage circuitry 27b that typically requires less semiconductor die space than the circuitry shown in FIG. 3A. Smart voltage circuitry 27b includes VCC ramp detector 30, 3.3 v/5 v VCC level detector 35, a low VCC detector 40, 5 v/12 v VPP level detector 55, and internal power supplies 60b, which include a stand-by five-volt internal supply (shown in FIG. 13B) that is used to charge the wordline switches 23 to 5.0 volts if the external supply voltage VCC is not 5.0 volts, and if the flash EEPROM 20 is operating in the stand-by mode. The stand-by five-volt internal supply is smaller than the five-volt internal supply used during read operations such that power consumption may be maintained within the limits of the stand-by operating mode. The wordline switches 23 are charged to the external supply voltage VCC during deep power down mode, regardless of whether or not external VCC is equal to 5.0 volts. As shown, the same circuitry that is used as a VCC ramp detector 30 may be used as a low VCC detector 40 to further reduce the amount of semiconductor die space required for the smart voltage circuitry 27b.

The basic operation of the smart voltage circuitry 27a shown in FIG. 3A will now be discussed. The VCC ramp detector 30 is provided to enable the internal power supplies 60a and to initialize the 3.3 v/5 v VCC level detector 35, the current source 45, and the pulse generator 50 when power is first applied to the flash EEPROM 20. The precise operation of VCC ramp detector 30 depends on the mode of operation for the flash EEPROM 20 when power is first applied.

Figure 23A:
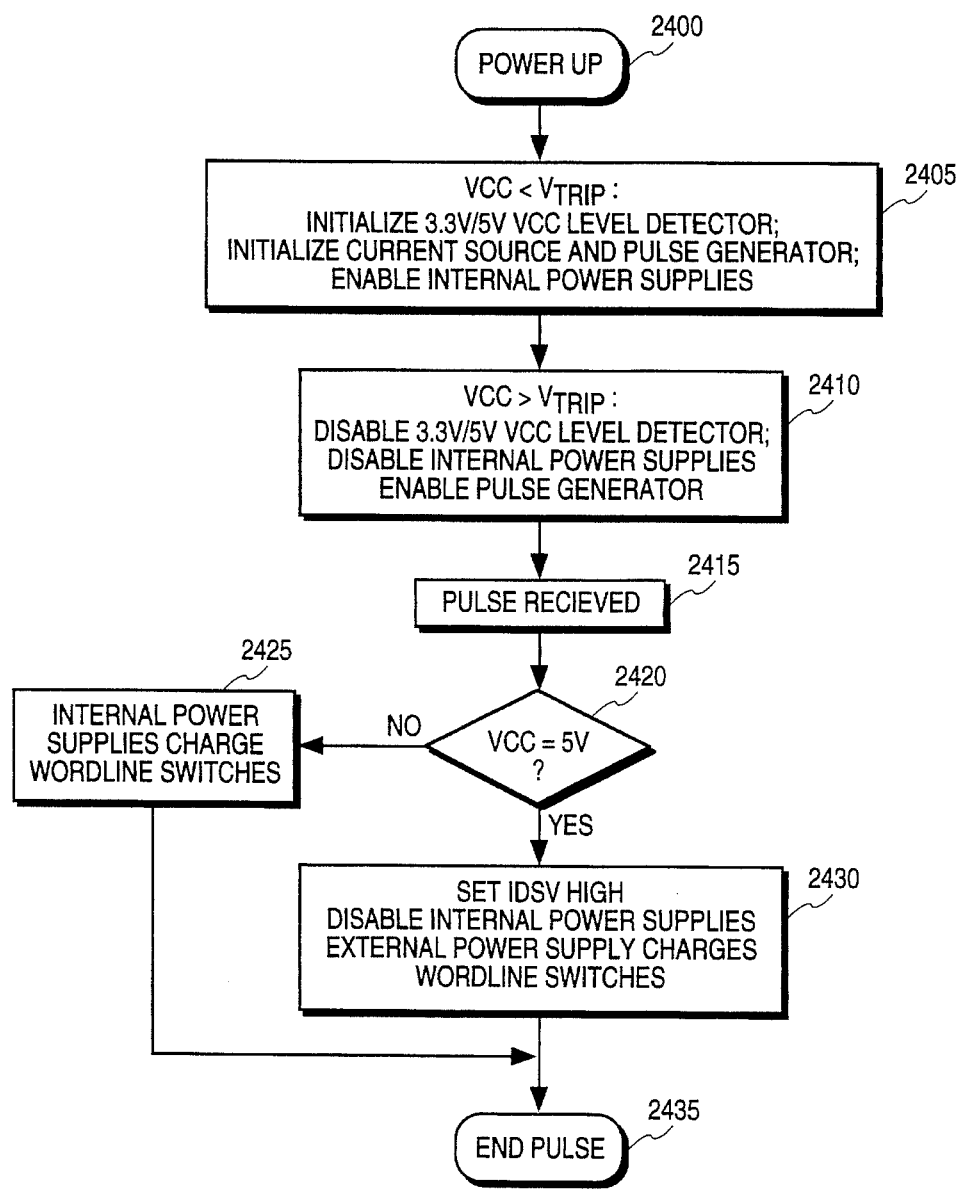
FIG. 23A and 23B are flow charts illustrating a method of operation for the flash EEPROM 20 that includes the smart voltage circuitry shown in FIG. 3A.

FIG. 23A shows a method of operation for the smart voltage circuitry 27a shown in FIG. 3A when the flash EEPROM 20 is operating in the deep power down or stand-by modes. At process block 2400, power is first supplied to the flash EEPROM 20. At process block 2405, the VCC ramp detector 30 responds to power-up by enabling the internal power supplies 60a to charge the wordline switches 23, by initializing the 3.3 v/5 v VCC level detector 35 to indicate a 3.3 volt external VCC, and by initializing the current source 45 and the pulse generator 50.

The VCC ramp detector 30 outputs a control signal HDRMVCD to the 3.3V/5V VCC level detector 35, the current source 45, the pulse generator 50, and the internal power supplies 60a. When the operating supply voltage VCC is less than a trip-point voltage $V_{trip}$ of the VCC ramp detector 30, the signal HDRMVCD tracks the external supply voltage VCC as it ramps from zero volts to its final value, and the appropriate circuitry is enabled or disabled.

Figure 22:
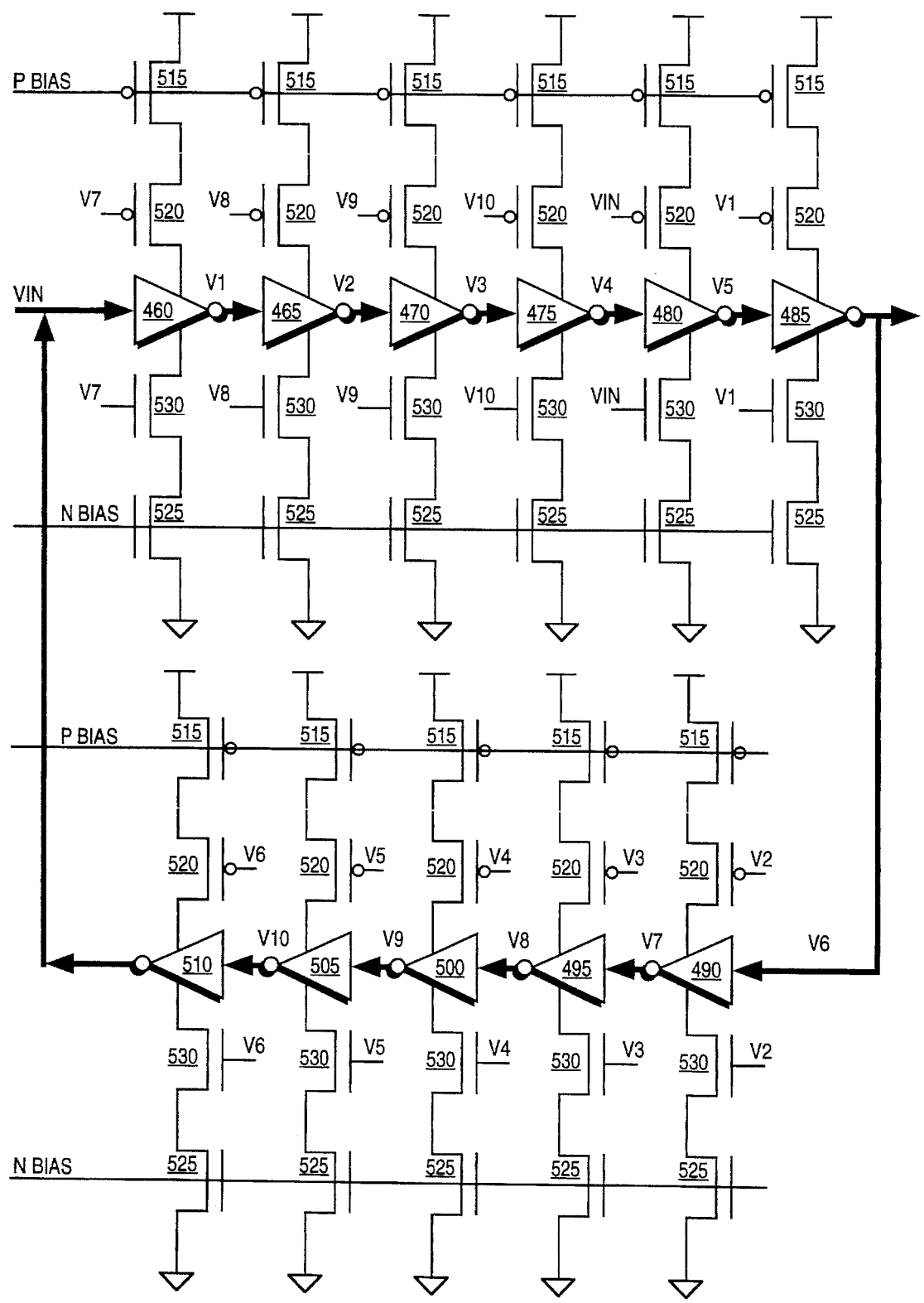
FIG. 22 shows an oscillator of the pulse generator circuit that uses subthreshold biasing.

At process block 2410, the supply voltage exceeds the trip-point voltage $V_{trip}$, which may be 2.7 volts or 2.9 volts, and the control signal HDRMVCD goes low. The VCC ramp detector 30 is switched off to reduce the power consumption of smart voltage circuitry 27a. In response to the control signal HDRMVCD going low, the 3.3 v/5 v VCC level detector 35 and the internal power supplies 60a are disabled, and the pulse generator 50 is enabled. The pulse generator 50 periodically supplies a logic high control pulse to the internal power supplies 60a and the 3.3 v/5 v VCC level detector 35 via the HDOUT signal line. The current source 45 is included to provide biasing currents PBIAS and NBIAS to the oscillators (as shown in FIG. 22) of the pulse generator 50.

At process block 2415, a control pulse is received by the internal power supplies 60a and the 3.3 v/5 v VCC level detector 35. The internal power supplies 60a are enabled for the duration of each control pulse so that the voltage of the wordline switches 23 may be maintained at 5.0 volts. The 3.3 v/5 v VCC level detector 35, which is coupled to receive the external supply voltage VCC, is also enabled for the duration of the control pulse. According to one embodiment, a six microsecond pulse is applied once every three milliseconds.

The 3.3 v/5 v VCC level detector 35 outputs a control signal ID5V to indicate the detected value of the external supply voltage VCC. As described above, the control signal ID5V is initialized during power-up of the flash EEPROM 20 to a logic low level for indicating that external VCC is not five volts. If the external supply voltage VCC is greater than a trip-point voltage $V_{3/5}$ for the 3.3 v/5 v VCC level detector 35 while the 3.3 v/5 v VCC level detector 35 enabled, the ID5V signal is set to a logic high level.

At process block 2420, if the external supply voltage VCC is detected as not being equal to five volts, the internal power supplies 60a are allowed to charge the wordline switches 23 at process block 2425. If the external supply voltage VCC is equal to Five volts, the 3.3 v/5 v VCC level detector 35 sets control signal ID5V logic high, which disables the internal power supplies 60a and enables external VCC to charge the wordline switches 23 at process block 2430. The high value of the control signal ID5V is latched. The current control pulse ends at process block 2435. Process blocks 2415–2435 are repeated for each control pulse received from the pulse generator 50. If external VCC was detected as being at five volts during a previous control pulse, and external VCC is detected as being 3.3 volts during the current control pulse, the internal charge pumps are enabled at process block 2425. The process shown in FIG. 23A may be repeated each time the flash EEPROM 20 is powered up in the stand-by or deep power down modes.

Figure 23B:
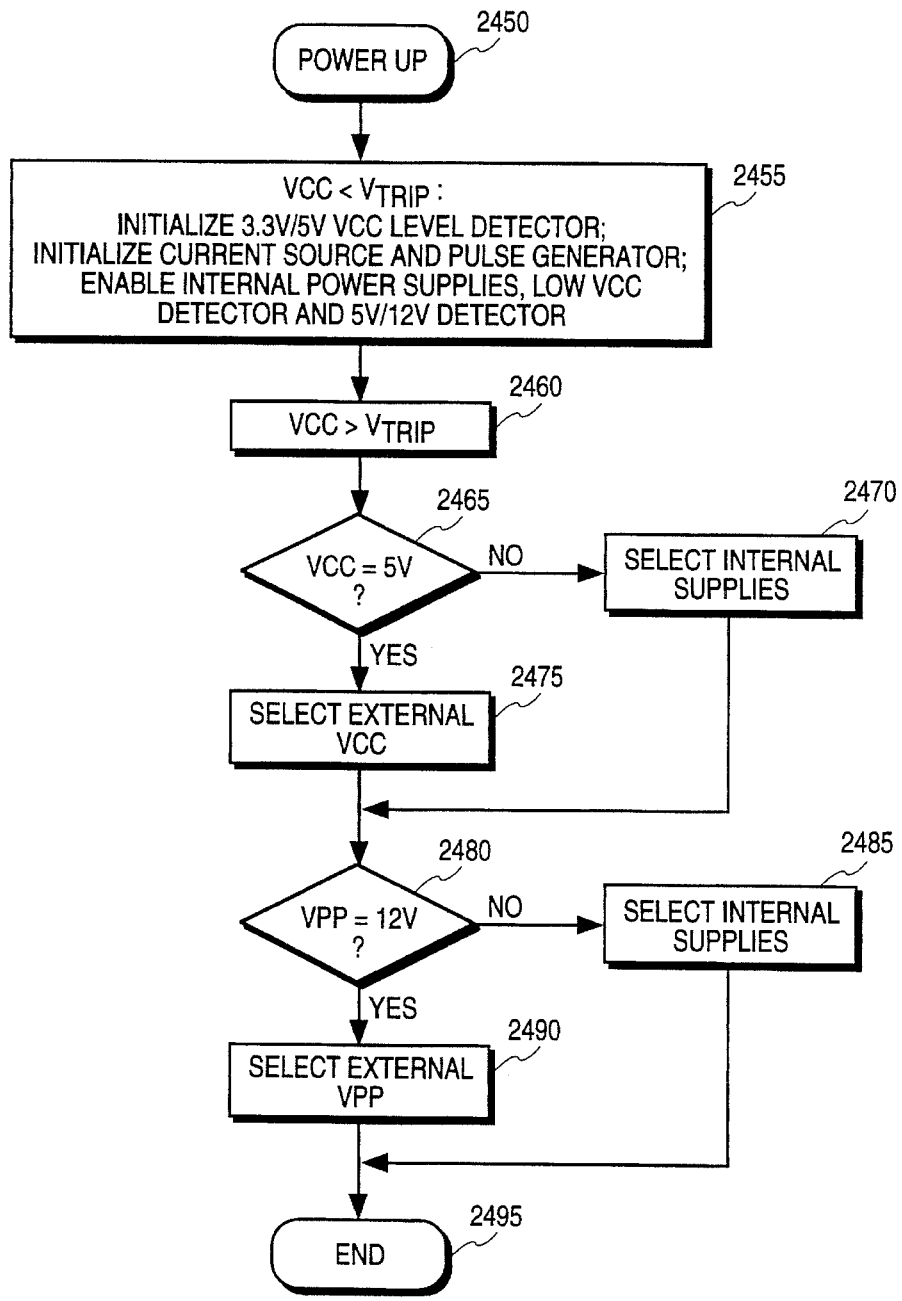

FIG. 23B shows a method of operation For the smart voltage circuitry 27a shown in FIG. 3A when the Flash EEPROM 20 is operating in the active mode. At process block 2450, power is initially supplied to the flash EEPROM 20. At process block 2455, wherein external VCC is less than the trip-point voltage $V_{trip}$ of the VCC ramp detector 30, the internal power supplies 60a are enabled to charge the wordline switches 23, the 3.3 v/5 v VCC level detector 35 is initialized to indicate a 3.3 volt external VCC, the current source 45 and the pulse generator 50 are initialized, and the low VCC detector 40 and the 5 v/12 v VPP level detector 55 are enabled.

The low VCC detector 40 monitors the VCC supply voltage to detect when the operating supply voltage VCC drops below a trip-point voltage $V_{lko}$ of the low VCC detector 40. The low VCC detector 40 provides the control signals PDPWR2 and PHLOWVCC to the control engine 26. If VCC drops below the trip-point voltage $V_{lko}$, the low VCC detector 40 sets the control signal PHLOWVCC to a logic high level such that the control engine 26 prevents programming and erase operations for the memory cell array 21. The low VCC detector 40 simultaneously sets the control signal PDPWR2 to a high level to reset the control engine 26. The low VCC detector 32 may be designed in accordance with the teachings of U.S. Pat. No. 5,301,161, entitled *Circuitry for Power Supply Voltage Detection and System Lockout for a Nonvolatile Memory*, issued of Marc Landgraf et al., and commonly assigned to Intel Corporation of Santa Clara, Calif. Alternatively, as will be described with respect to FIG. 3B, the VCC ramp detector 30 can be configured to operate as the low VCC detector after power-up of the flash EEPROM 20.

The 5 v/12 v VPP level detector 55 is coupled to the programming supply voltage VPP for determining whether VPP is 5.0 volts or 12.0 volts. The 5 v/12 v VPP level detector 55 outputs a control signal PD5VPP to the internal power supplies 60a and the control engine 26. The control signal PD5VPP is initially high to indicate a five volt VPP level. The internal power supplies 60 use the control signal PD5VPP to select either the external VPP or the internal supplies during programming and erase operations. The control engine 26 may use the control signal PD5VPP to select the appropirate programming and erase algorithms. The 5 v/12 v VPP level detector 55 may be disabled during stand-by and deep power down to further reduce the power consumption of the smart voltage circuitry 27a.

Returning to FIG. 23B, at process block 2460, external VCC exceeds the trip-point voltage $V_{trip}$. All circuits remain enabled, and the pulse generated by the pulse generator is locked out. The remaining process blocks of FIG. 23B may occur in a different order than shown, depending on the type of access requested while the flash EEPROM 20 is in the active mode.

The 3.3 v/5 v VCC level detector 35 remains enabled after the external voltage VCC exceeds the trip-point voltage $V_{trip}$ of the VCC ramp detector. If the 3.3 v/5 v VCC level detector 35 continues to indicate that external VCC is not equal to five volts at process block 2465, the internal supplies 60a are selected to charge the wordline switches 23 to five volts at process block 2470. If the 3.3 v/5 v VCC level detector 35 indicates that external VCC is equal to five volts at process block 2465, the external supply voltage VCC is selected to charge the wordline switches 23 to five volts at process block 2475.

At process block 2480, it is determined if the external supply voltage VPP is equal to twelve volts. If external VPP is not twelve volts, the internal power supplies 60a are selected to provide the programming and erase voltages at process block 2485. If external VPP is twelve volts, the external supply voltage VPP is selected to provide the voltages for program and erase operations at process block 2490. The process ends at process block 2495. The process of FIG. 23B may be repeated each time the flash EEPROM 20 is powered up in the active mode.

Figure 24A:
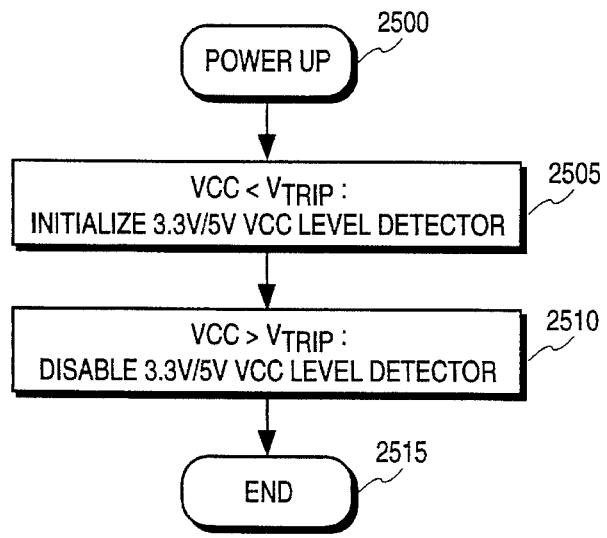
FIG. 24A and 24B are flow charts illustrating a method of operation for the flash EEPROM 20 that includes the smart voltage circuitry shown in FIG. 3B.

The operation of the smart voltage circuitry 27b shown in FIG. 3B is now discussed with reference to FIGS. 24A–24B. FIG. 24A shows the operation of the smart voltage 27b when the flash EEPROM 20 is powered up while operating in the deep power down mode. Power is supplied at process block 2500. At process block 2505, the 3.3 v/5 v VCC level detector is initialized to indicate a 3.3 volt external VCC. When external VCC is greater than the trip-point voltage $V_{trip}$ of the VCC ramp detector 30 at process block 2510, the 3.3 v/5 v VCC level detector is disabled. The wordline switches 23 are charged to the external VCC level. The process ends at process block 2515.

Figure 24B:
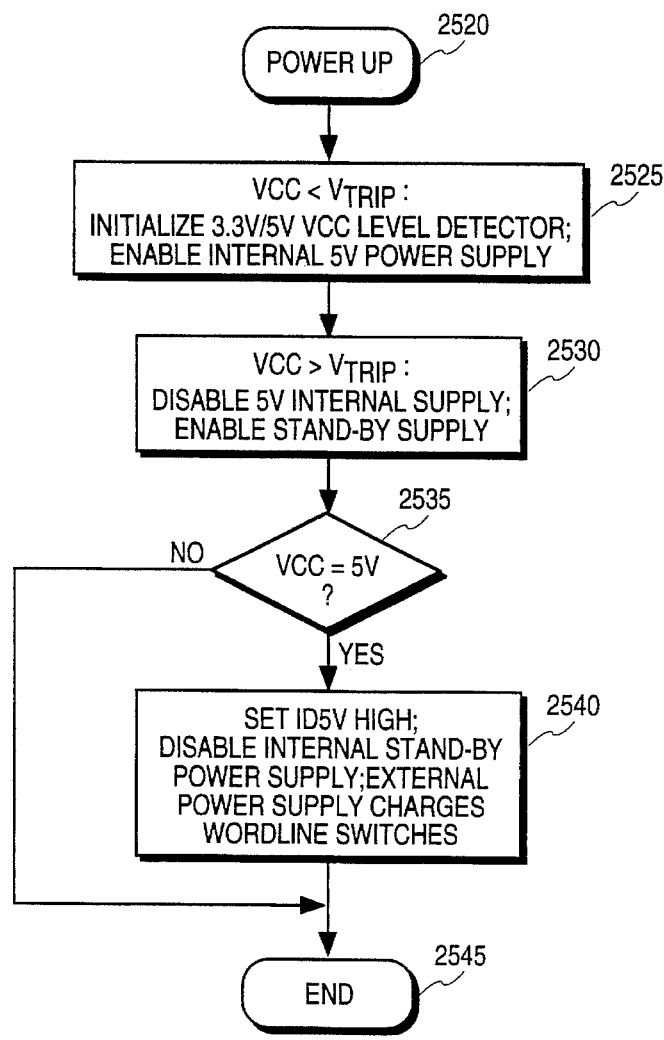

FIG. 24B shows a method of operation for the smart voltage circuitry 27b shown in FIG. 3B when the flash EEPROM 20 is operating in the stand-by mode. At process block 2520, power is first supplied to the flash EEPROM 20. At process block 2525, the VCC ramp detector 30 responds to power-up by enabling an internal five-volt power supply (shown in FIG. 13B) to charge the wordline switches 23 and initializing the 3.3 v/5 v VCC level detector 35 to indicate a 3.3 volt external VCC.

At process block 2530, the supply voltage exceeds the trip-point voltage $V_{trip}$. The internal five-volt power supply is disabled, and the internal stand-by power supply is enabled. The 3.3 v/5 v VCC level detector 35 remains enabled. The 3.3 v/5 v VCC level detector 35 continuously monitors external VCC at process block 2535. If external VCC is equal to 5.0 volts, the 3.3v/5 v VCC level detector 35 sets the control signal ID5V logic high, which disables the internal stand-by power supply such that the wordline switches are charged by the external supply voltage VCC. The operation of the smart voltage circuitry 27b when powered up in the active mode is similar to that shown in FIG. 23B.

The smart voltage circuitry 27 of the flash EEPROM 20 allows the same flash EEPROM 20 to be used in computer systems that provide different operating and programming voltages. The smart voltage circuitry 27 may be adapted to detect and select different supply voltages than those described above; however, the goals of compatibility and versatility should be weighed against the need for low power consumption and the desire for increased density for the memory cell array 21. Accordingly, each component of smart voltage circuitry 27 should be designed to consume reduced power and to require reduced die space. Some of the components of the smart voltage circuitry 27 will now be discussed in greater detail.

VCC RAMP DETECTOR

The VCC ramp detector 30 will now be discussed in more detail. FIG. 4 shows a latch mode VCC ramp detector 30 that is capable of being in either an "untripped state," wherein the externally provided operating supply voltage VCC is less than the trip-point voltage $V_{trip}$, or a "tripped state," wherein the external supply voltage VCC is greater than the trip-point voltage $V_{trip}$. The VCC ramp detector 30 shown in FIG. 4 is said to be a "latch mode" VCC ramp detector because it is disabled once it enters the tripped state. Little or no current is consumed by the latch mode VCC ramp detector 30 while it is in the tripped state. For one embodiment of the flash EEPROM 20, the latch mode VCC ramp detector 30 is designed to operate only at initial power up of the flash EEPROM 20. The VCC ramp detector of FIG. 4 may be used in the smart voltage circuitry 27a of FIG. 3A.

The VCC ramp detector 30 is shown as including a flash cell 65, an n-channel field effect transistor ("FET") 70 having its source coupled to the drain of the flash cell 65, a p-channel FET 75 having its drain coupled to the drain of FET 70 and its source coupled to external VCC, and an output circuit 85 having its input connected to the node 80 defined by the drain of FET 70 and the drain of FET 75. The output circuit 85 may include a first inverter 86 having its input connected to node 80 and its output coupled to the input of a second inverter 87, which outputs the control signal HDRMVCD. The output of inverter 86 may be fed back to the gate of FET 75. The inverters 86 and 87 are powered by the input voltage, which, for this example, is the external supply voltage VCC. The latch mode VCC ramp detector 30 also includes a start-up circuit 90 for initially biasing the node 80 and a drain bias control circuit 100 for providing a biasing voltage VDBIAS to FET 70.

The flash cell 65 is primarily used as a transistor rather than as a memory element. Because the threshold voltage of the flash cell 65 can be varied, the trip-point voltage $V_{trip}$ of the latch mode VCC ramp detector 30 may be varied by programming the flash cell to different $V_t$ levels. The flash cell 65 may alternatively be any type of nonvolatile memory cell, including an EPROM or EEPROM memory cell. Wherein a standard FET may be used in place of the flash cell 65, the flash cell 65 is advantageous because it may be programmed to account for process variations.

When the computer system 10 is initially switched on, the external supply voltage VCC begins to ramp from zero volts to the final VCC value, which may be either 3.3 volts or 5.0 volts. The start-up circuit 90 is coupled to VCC for initially biasing the node 80 so that the output circuit 85 ramps up with the external supply voltage VCC. For example, the start-up circuit 90 may be configured to output the external VCC until VCC has reached a predetermined voltage level such as 1.5 volts, which causes the output of inverter 86 to go to system ground VSS. The start-up circuit 90 is then switched off and node 80 continues to be pulled up towards the external supply voltage VCC by FET 75, which is switched on in response to the output of the inverter 86 going to system ground VSS. The control signal HDRMVCD output by the output circuit 85 tracks voltage at node 80. The latch mode VCC ramp detector 30 enters the untripped state when FET 75 is switched on.

FET 70 is a device that biases the drain of flash cell 65 so that flash cell 65 is prevented from being accidentally programmed. The drain bias control circuit 100 supplies the bias voltage VDBIAS to the gate of FET 70 to bias FET 70 such that the drain of flash cell 65 does not exceed 1.5 volts. Wherein another type of nonvolatile memory cell is used in place of the flash cell 65, FET 70 may not be required.

As shown, the external operating supply voltage VCC is applied to the gate of flash cell 65, which is programmed to have a threshold voltage $V_t$ that sets the trip-point voltage $V_{trip}$ of the latch mode VCC ramp detector circuit 30 to the desired value. According to one embodiment, the trip-point voltage $V_{trip}$ is equal to 2.9 volts. Typically, the threshold voltage $V_t$ of the flash cell is programmed such that the voltage at node 80 is detected as a logic low when the external supply voltage exceeds the trip-point voltage $V_{trip}$. Because the flash cell 65 is programmable, process variations in the devices of the latch mode VCC ramp detector 30 may be accounted for by programming the $V_t$ of flash cell 65. Flash cell 65 may be programmed by applying the appropriate voltages to flash cell, as shown in FIG. 2.

When the gate-to-source voltage $V_{gs}$ of the flash cell 65, which is equal to VCC-VSS, exceeds the threshold voltage $V_t$ of the flash cell 65, the flash cell 65 turns on such that a drain-source current $I_{ds}$ flows through the flash cell 65, pulling the node 80 down towards system ground VSS. When the voltage at node 80 is pulled sufficiently low, the inverter 86 outputs the current value of the external supply voltage VCC, which switches FET 75 off so that no DC current flows from VCC to ground. The control signal HDRMVCD is set to system ground VSS. The latch mode VCC ramp detector 30 enters the tripped state when the FET 75 is switched off, and the latch mode VCC ramp detector 30 will not return to the untripped state until external VCC goes to zero or the VCC ramp detector 30 is reset by external logic.

FIG. 5 shows waveforms that describe the operation of the VCC ramp detector shown in FIG. 4. Waveform 91 shows the behavior of the external operating supply voltage VCC; waveform 92 shows the voltage of the node 80; waveform, 93 shows the voltage at node 88, which is defined between inverters 86 and 87; and waveform 94 shows the voltage at the output of the VCC ramp detector 30. As shown, the output of the output circuit 85 tracks the external supply voltage VCC until VCC reaches the trip-point voltage $V_{trip}$, at which time the output of output circuit 85 is pulled down to system ground VSS. The output circuit 85 may alternatively include only the inverter 86 such that the output signal HDRMVCD is shown by waveform 93.

The VCC ramp detector shown in FIG. 4 may be altered to act as a general purpose voltage detector that continuously monitors the value of the externally provided operating supply voltage VCC. A VCC ramp detector that operates in this manner is called a "continuous mode" voltage detector. A continuous mode voltage detector may freely pass between the tripped and untripped states in response to the input voltage.

FIG. 6 shows a continuous mode voltage detector 96. The continuous mode voltage detector 96, like the latch mode VCC ramp detector, includes flash cell 65, FET 70, FET 75, output circuit 85, and drain bias control circuit 100. The start-up circuit 45 is not required because a bias signal VCBIAS is applied to the gate of the p-channel FET 75 by the current bias circuit 95 so that the node 80 is pulled towards the supply voltage VCC via the drain-source current of FET 75. To reduce the current consumed by the continuous mode VCC ramp detector, the bias signal VCBIAS supplied by the current bias circuit 95 biases FET 75 to be a weak pull-up device. The bias signal VCBIAS is such that the current sourced by FET 75 is independent from the value of the external operating supply voltage VCC.

The control signal HDRMVCD supplied by the output circuit 85 tracks the voltage of node 80. When the external supply voltage VCC is less than the threshold voltage $V_t$ of the flash cell 65, the voltage at node 80 ramps up with the external supply voltage VCC. When the external supply voltage VCC exceeds the threshold voltage $V_t$ of the flash cell 65, the flash cell 65 is switched on such that the voltage at node 80 is pulled towards ground and the output circuit 85 sets the control signal HDRMVCD to a logic low level. Should the external supply voltage VCC drop below the threshold voltage of the flash cell 65, the continuous mode VCC ramp detector 30 reenters the untripped state, and HDRMVCD is set to the present level of the external supply voltage VCC. The continuous mode VCC ramp detector may therefore be used as a low VCC detector.

FIG. 7 shows waveforms that describe the behavior of the continuous mode voltage detector. Waveform 101 shows the behavior of the external operating supply voltage VCC; waveform 102 shows the voltage at node 80 in response to the supply voltage VCC; waveform 103 shows the voltage at node 88; and waveform 104 shows the signal HDRMVCD output by the continuous mode VCC ramp detector 30. Waveforms 102 and 104 show that the continuous mode voltage detector 96 detects when the operating supply voltage VCC falls below the trip point voltage $V_{trip}$ so that the voltage detector may be used as a low VCC detector circuit or as VCC or VPP level detector circuit. The output circuit 85 may alternatively include only the inverter 86 such that the output signal HDRMVCD is shown by waveform 103.

Figures 8, 9:
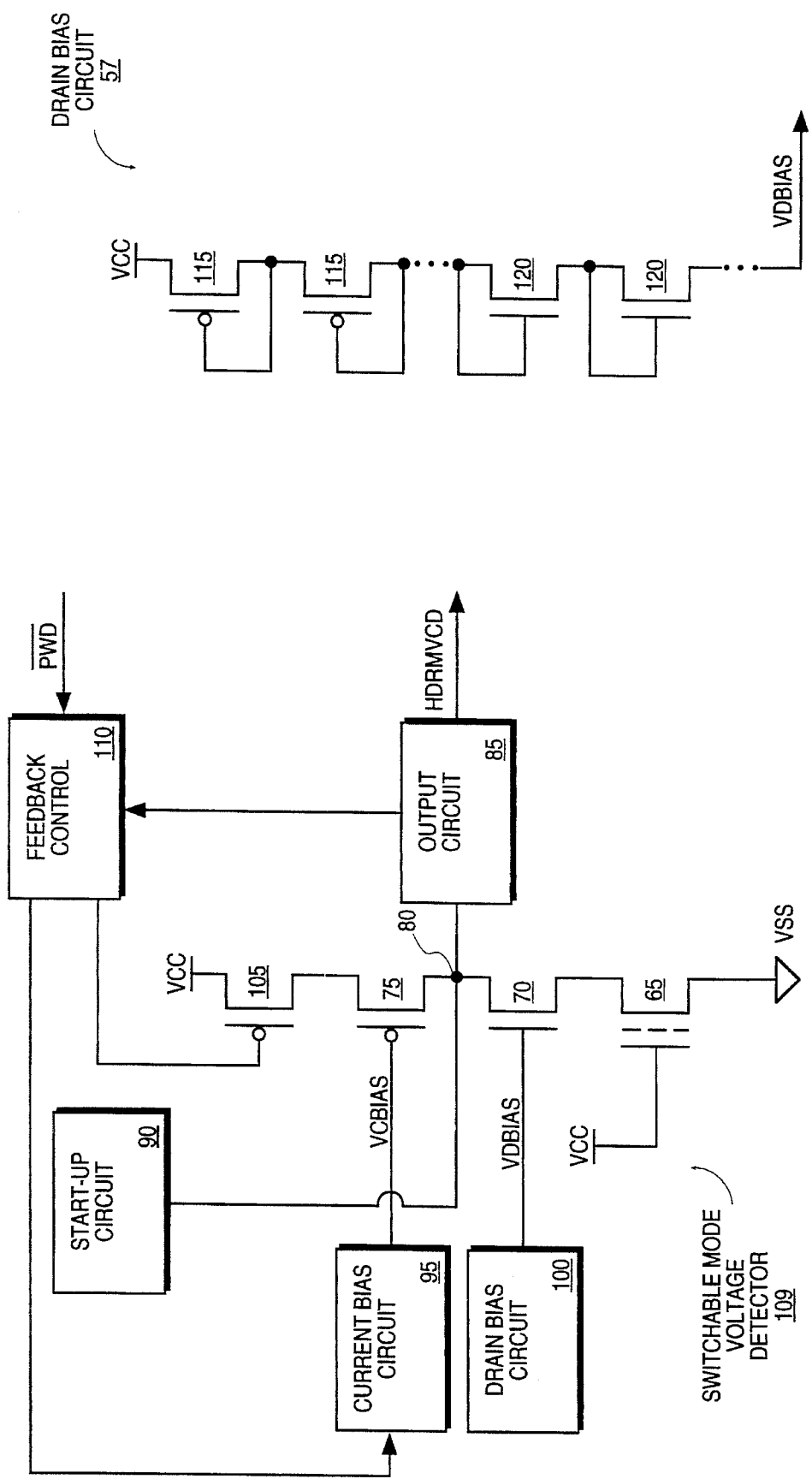
FIG. 8 shows a VCC detector capable of operating in both the latch mode and the continuous mode.
FIG. 9 shows a drain bias control circuit for the VCC detector in more detail.

FIG. 8 shows a switchable mode voltage detector 109 that can operate in the latch mode and the continuous mode. According to one embodiment, the switchable mode voltage detector 109 operates as the latch mode VCC ramp detector 30 at power-up and in the deep power down mode. The switchable mode voltage detector 109 operates in the continuous mode as the low VCC detector 40 after power-up while the flash EEPROM 20 operates in the stand-by and active modes. The switchable mode voltage detector 109 includes flash cell 65, FET 70, FET 75, output circuit 85, start-up circuit 90, current bias circuit 95, drain bias circuit 100, p-channel FET 105, and feedback control circuit 110. The p-channel FET 105 has its drain coupled to the source of FET 75, its source coupled to the operating supply voltage VCC, and its gate coupled in a feedback configuration with the output circuit 85 via feedback control circuit 110.

When the flash EEPROM is initially powered-up, the feedback control circuit 110 couples the output of the inverter 86 (as shown in FIG. 6) to the gate of FET 105, and the start-up circuit 90 biases node 80 so that the output of inverter 86 goes low, switching FET 105 on. The switchable mode voltage detector 109 therefore initially operates in the latch mode. Once the value of the operating supply voltage VCC exceeds the threshold voltage $V_t$ of flash cell 65, the VCC ramp detector 30 is placed in the tripped state where it remains until the flash EEPROM enters the stand-by or active modes. When the flash EEPROM 20 enters the stand-by or active modes, the feedback control circuit decouples the output of the output circuit 85 from the gate of the FET 105 and instead supplies a biasing voltage to the gate of FET 105 so that FET 105 is switched on. The VCC ramp detector 30 is therefore in the continuous mode and may be configured to act as the low VCC detector 40.

As described above, the flash EEPROM 20 is capable of operating in the stand-by and deep power down modes, as well as in the active mode. For the stand-by and deep power down modes, it is important to reduce the power consumption of the continuous mode and switchable mode voltage detectors so that the overall power consumption of the flash EEPROM 20 remains within defined limits. One way to reduce power consumption during the stand-by mode is to bias FET 75 to act as a weak pull-up device having a high impedance such that current flow is reduced. For the deep power down mode, the power consumption of the continuous mode voltage detector 96 can be reduced to zero by switching off FET 75. The switchable mode voltage detector 109 may switch off both FET 75 and FET 105 during the deep power down mode to reduce power consumption.

FIG. 9 shows a drain bias control circuit in more detail. As shown, the biasing voltage VDBIAS is derived from the operating supply voltage VCC to control the drain voltage $V_{drain}$ at the drain of the flash cell 65. The drain voltage $V_{drain}$ of the flash cell 65 may be expressed by the following equation:

$$V_{drain} = VDBIAS - V_{t70},$$

wherein $V_{t70}$ is the threshold voltage of FET 70. The biasing voltage VDBIAS is equal to VCC minus any diode drops associated with diode connected FETs 115 and 120 that may be inserted between the operating supply voltage VCC and the output of the drain bias control circuit 100.

According to one embodiment, the value of VDBIAS is selected such that the maximum drain voltage $V_{drain}$ is less than 1.5 volts, regardless of the value of the trip-point voltage $V_{trip}$. Once flash cell 65 switches on, which occurs when the external supply voltage VCC exceeds the trip-point voltage of the VCC ramp detector 30, the drain voltage $V_{drain}$ is pulled to ground. Therefore, the maximum drain voltage occurs when VCC is equal to the trip-point voltage $V_{trip}$. As the trip-point voltage increases, more diode-connected FETs may be connected in series as shown in FIG. 9 to reduce the value of VDBIAS such that the drain voltage $V_{drain}$ does not exceed the predefined maximum drain voltage.

Figure 10:
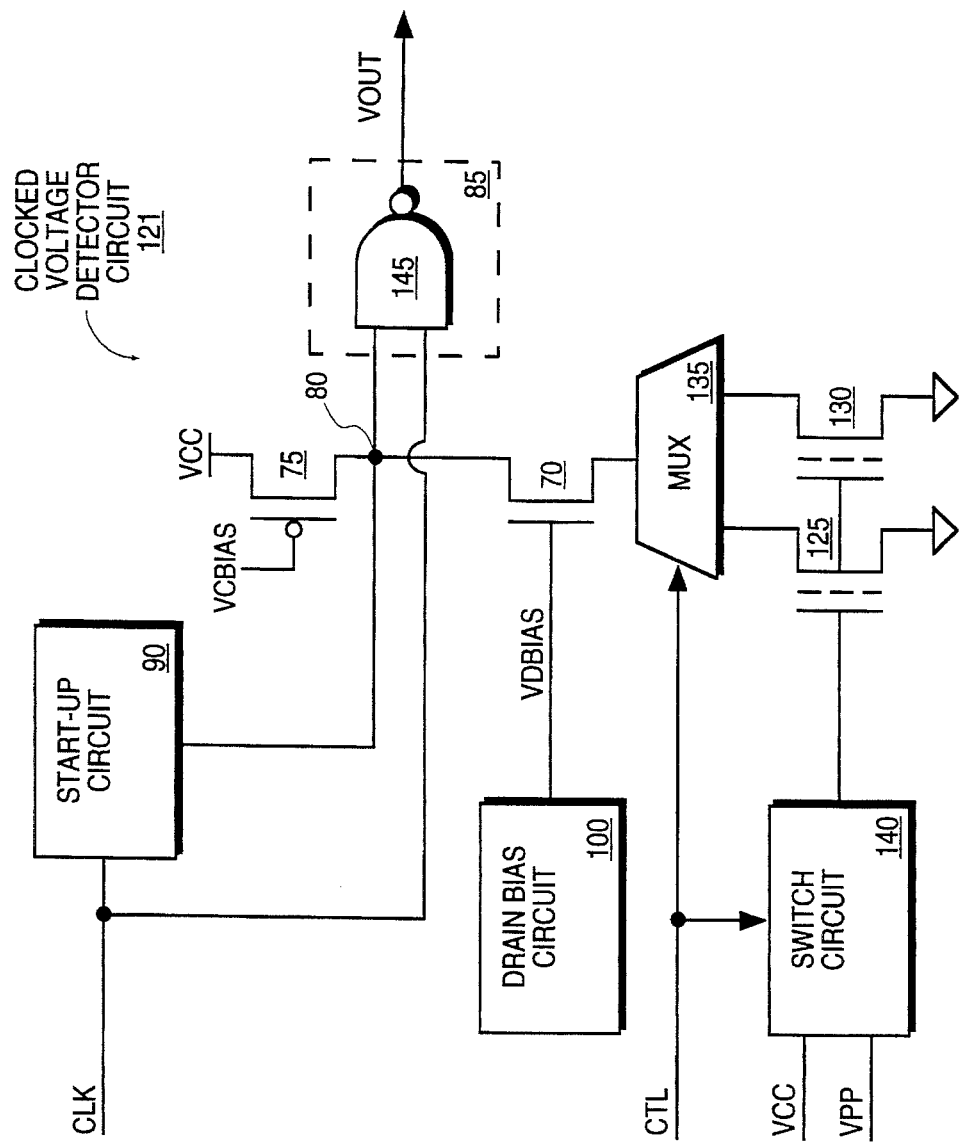
FIG. 10 shows a clocked voltage detector circuit.

FIG. 10 shows a continuous mode clocked voltage detector circuit 121 that operates similarly to the voltage detector circuits shown in FIGS. 4, 6, and 8. The clocked voltage detector circuit 121 may be altered to operate in both the continuous mode and the latch mode as shown in FIG. 8. The design of the clocked voltage detector circuit 121 reflects the fact that supply voltage levels typically do not change that rapidly. Therefore, the clocked voltage detector circuit 121 is designed to detect the values of both the operating supply voltage VCC and the programming supply voltage VPP at different times. The clocked voltage detector circuit 121 includes flash cells 125 and 130, one of which is selected by the multiplexor 135 to define the trip-point voltage $V_{trip}$ of the clocked voltage detector circuit 121 in response to the control signal CTL, which may be provided by the control engine 26. The threshold voltage of flash cell 125 may be programmed such that the clocked voltage detector circuit 121 operates as the 3 v/5 v VCC level detector when flash cell 125 is selected. Similarly, the threshold voltage of flash cell 130 may be programmed such that the clocked voltage detector circuit 121 operates as the 5 v/12 v VPP level detector when flash cell 130 is selected. More flash cells may be added so that the clocked voltage detector may also operate as the VCC ramp detector circuit and the low VCC level detector circuit. The power supply of the NAND gate 145 may be multiplexed to be either VCC or VPP.

Figure 11:
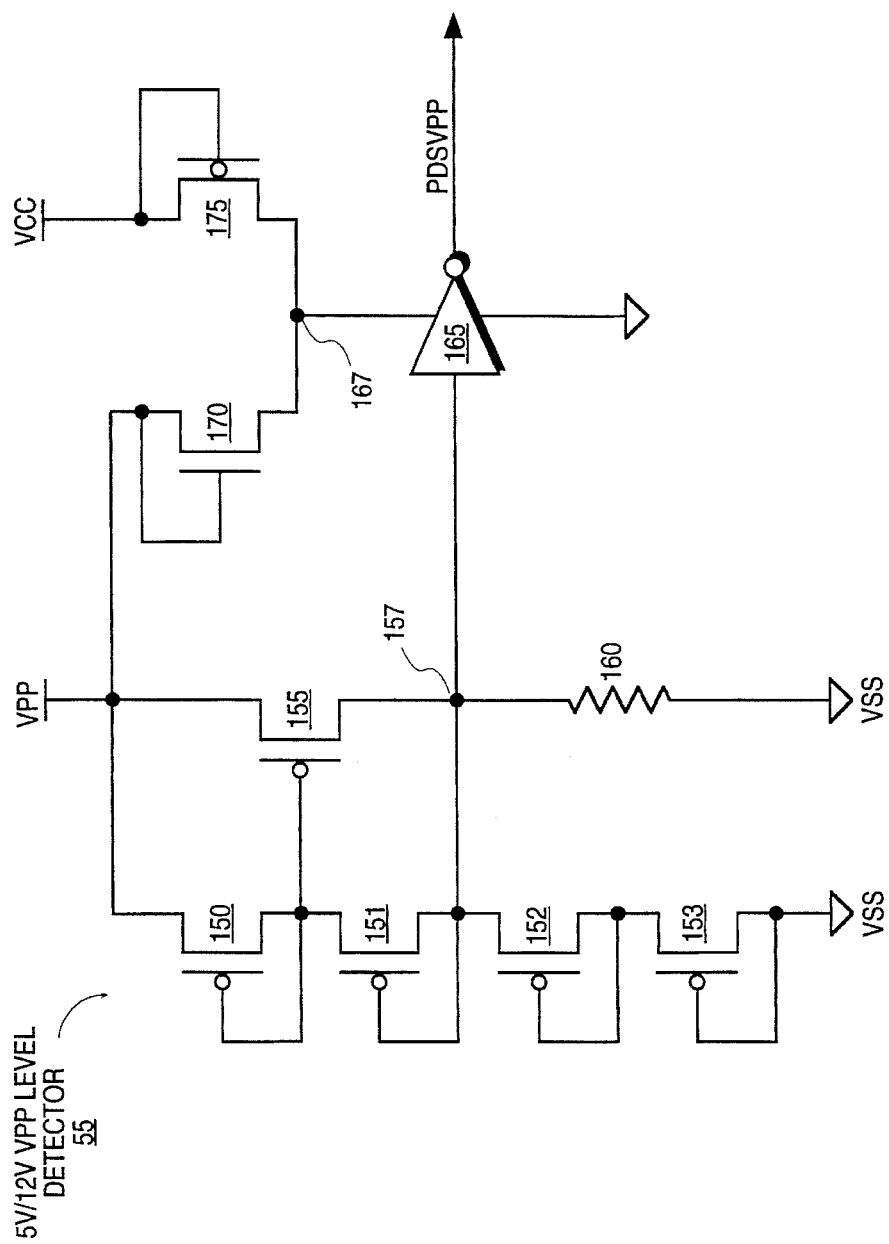
FIG. 11 shows one 5/12 v VPP level detector circuit.

A switch circuit 140 is coupled to the external supply voltages VCC and VPP. The switch circuit 140 may include a resistive divider circuit (not shown) to reduce the external programming supply voltage VPP to a lower level. The control signal CTL selects one of the supply voltages to be provided to the gates of the flash cells 125 and 130. The clocked voltage detector circuit 121 is clocked by a CLK signal. For the output circuit 85, the clocked voltage detector 121 includes a two-input NAND gate 145 having one input coupled to node 80 and the other input coupled to the CLK signal. When the CLK signal is low, the output of the NAND gate 145 is logic high. When the CLK signal goes high, the output of the NAND gate 145 is determined by the voltage at node 80. If the selected supply voltage is greater than the threshold voltage of the selected flash cell, the voltage at node 80 is set to system ground VSS and the NAND gate 145 outputs a logic high voltage. Otherwise, the voltage at node 80 is high such that the NAND gate 145 outputs a logic low voltage. One or more latches (not shown) may be coupled to the output of the clocked voltage detector circuit and controlled by the CLK and CTL circuits to latch the output of the clocked voltage detector circuit 121 at the appropriate times. These latched values may be provided to the control engine 26. 5V/12V VPP DETECTOR The 5 v/12 v VPP level detector 55 detects whether the programming supply voltage VPP is equal to 5 volts or 12 volts. FIG. 11 shows the 5 v/12 v VPP level detector 55 according to one embodiment. The 5 v/12 v VPP level detector 55 includes p-channel FETs 150–153 and 155, n-channel FETs 170 and 175, resistor 160, and inverter 165. The source of FET 150 is coupled to the external supply voltage VPP, and the drain of FET 150 is coupled to the source of FET 151. The drain of FET 151 is coupled to the source of FET 152, which has its drain coupled to the source of FET 153. The drain of FET 153 is coupled to system ground VSS. Each of the FETs 150–153 have their gates coupled to their drains.

The voltage at the node between the drain of FET 150 and the source of FET 151 is coupled to the gate of FET 155. The source of FET 155 is coupled to the external programming supply voltage VPP, and the drain of FET 155 is coupled to a node 157. The resistor 160 is coupled between node 157 and system ground VSS. The inverter 165 has its input coupled to the node 157 for detecting the voltage at node 157. The inverter 165 is powered on the low side by system ground VSS and on the high side by the voltage at node 167, which is determined by the n-channel FETs 170 and 175.

The gate and drain of FET 170 are coupled to the programming supply voltage VPP, and the gate and drain of FET 175 are coupled to the external operating supply voltage VCC. The n-channel FET 175 is shown as a "K device" that has a low threshold voltage and that can operate at high voltages. The FETs 170 and 175 are provided to better ensure correct operation of the 5 v/12 v VPP level detector 55 for the case wherein the operating supply voltage VCC is greater than the programming supply voltage VPP.

The operation of the circuit shown in FIG. 11 will now be discussed with respect to the time when power is first supplied to the flash EEPROM 20, at which time the external programming supply voltage VPP is equal to zero volts and begins to ramp towards its final value, which may be 5.0 volts or 12 volts. Initially, the voltage at node 157 is at system ground VSS, and the inverter 165 sets the control signal PD5VPP at a logic high level. As the programming supply voltage VPP increases, the amount of drain-source current for FET 155 increases, and node 157 begins to be pulled up towards the final value of VPP. If external VPP is sufficiently high, FET 155 acts as a strong pull-up device that overcomes the pull-down resistor 160. The inverter 165 sets the control signal PD5VPP at a logic low level if the voltage at node 157 is detected to be at a logic high level, indicating that the external programming supply voltage VPP is 12 volts.

Wherein the circuit shown in FIG. 11 is sufficient for detecting the value of the programming supply voltage VPP, improvements may be made. For example, if the operating supply voltage VCC is greater than the programming supply voltage VPP, the circuit shown in FIG. 11 draws a constant DC current. Further, the resistor 160 occupies a relatively large amount of semiconductor die space, which may affect the density of the memory cell array 21.

Figure 12:
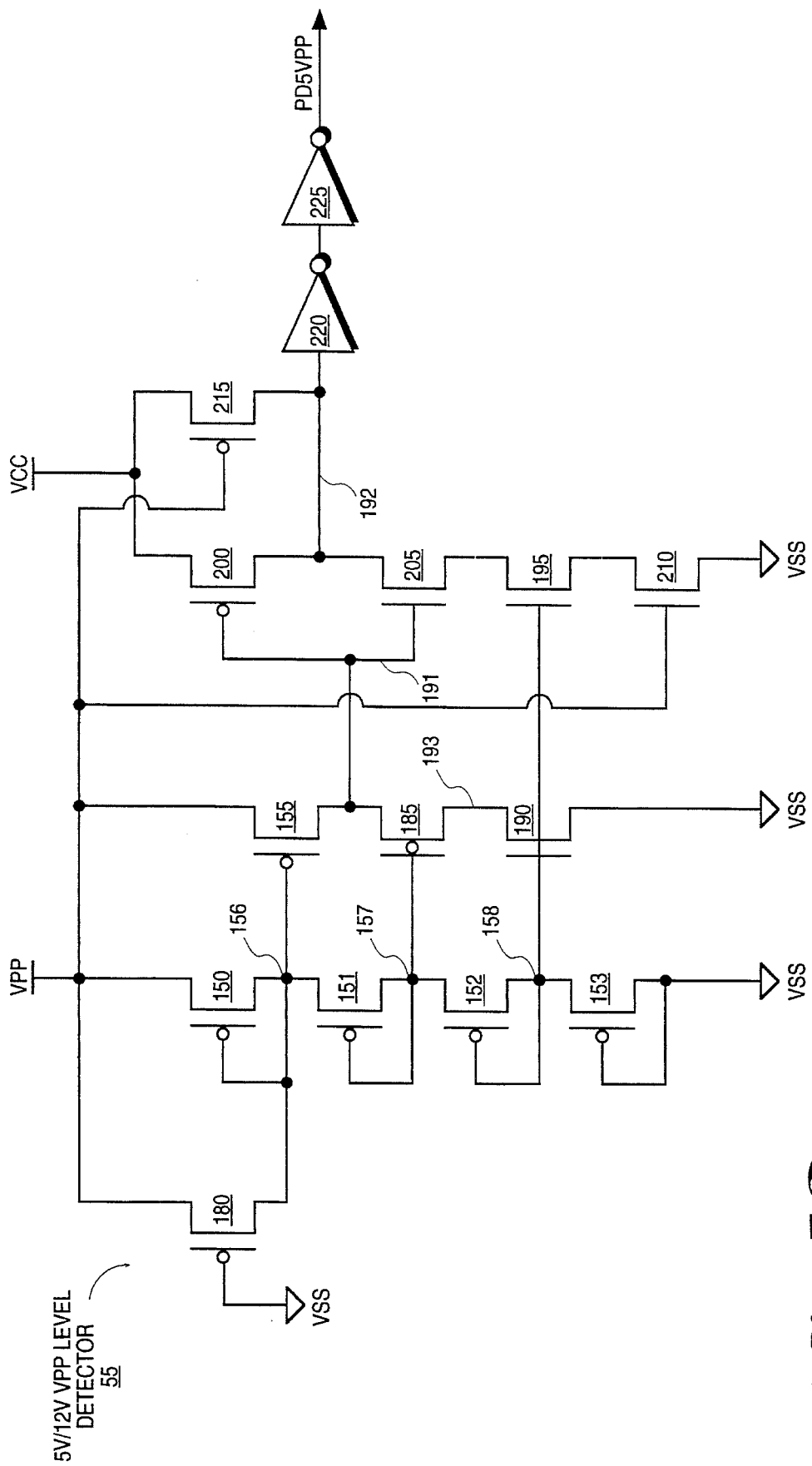
FIG. 12 shows a second 5/12 v VPP level detector circuit.

FIG. 12 shows the 5 v/12 v VPP level detector 55 according to a second embodiment. To reduce the amount of semiconductor die space required for the 5 v/12 v VPP level detector 55, the resistor 160 has been replaced with n-channel transistors 185 and 190, which present an active load to the drain of FET 155. The 5 v/12 v VPP level detector of FIG. 12 is shown as including p-channel FETs 150–153, 155, 180, 200, and 215; n-channel FETs 185, 190, 195, 205, and 210; and inverters 220 and 225.

The FETs 150–153 are coupled as described above with respect to FIG. 11, and the gate of FET 155 is coupled to receive the voltage from the node 156 defined between the drain of FET 150 and the source of FET 151. The source of FET 155 is coupled to the programming supply voltage VPP, and the drain of FET 155 is coupled to the drain of FET 185, which is a K device. FET 185 is provided to isolate FET 190 from the high voltages that may arise at node 191, and FET 185 may not be required if the voltage detector circuit shown in FIG. 12 is used to detect lower voltages, which may occur if the circuit were adapted to be a 3.3 v/5 v VCC level detector. The gate of FET 185 is coupled to receive the voltage from the node 157 defined between the drain of FET 151 and the source of FET 152, and the source of FET 185 is coupled to the drain of FET 190. FET 190 has its source coupled to system ground VSS and its gate coupled to the node 158 defined between the drain of FET 152 and the source of FET 153.

A node 191 is defined between the drain of FET 155 and the drain of 185. The voltage at node 191 drives the gates of p-channel FET 200 and n-channel FET 205, which are coupled to operate as an inverter. The source of FET 200 is coupled to the operating supply voltage VCC, and the drain of FET 200 is coupled to the drain of FET 205. The node 192 defined between the drain of FET 200 and the drain of FET 205 determines the value of the control signal PD5VPP output by the 5 v/12 v VPP level detector 55. The inverter 220 has its input coupled to node 192 and its output coupled to the input of inverter 225, which outputs the control signal PD5VPP. The FET 215 has its gate coupled to the programming supply voltage VPP, its source coupled to the operating supply voltage VCC, and its drain coupled to the node 192. FET 195 has its gate coupled to node 158 and its source coupled to the drain of FET 210, which has its source coupled to system ground VSS and its gate coupled to the programming supply voltage VPP. FET 195 is selected to have the same characteristics as FET 190.

FETs 150–153 may be identical devices each having a channel width of five microns and a channel length of twenty microns. FETs 150–153 act as a voltage divider and provide voltages to the gates of FETs 155 and 190 such that the absolute value of the gate-to-source voltages $V_{GS}$ for both FET 155 and FET 190 are equal. For example, the gate voltage for FET 155 is equal to three-fourths VPP such that $V_{GS155}$ is equal to negative one-fourth VPP, and the gate voltage for FET 190 is equal to one-fourth VPP such that $V_{GS190}$ is equal to one-fourth VPP. FETs 190 and 195 are also identical devices having a channel width of two microns and a channel length of thirty microns. FET 155 may actually be four identical FETs coupled in parallel, each having a channel width of five microns and a channel length of twenty microns. Example threshold voltages for FETs 155, 185, 190, and 195 are 1.5 volts for FET 155, 0.2 volts for FET 185, and 1.0 volt for FETs 190 and 195.

FET 155 essentially acts as a pull-up device for node 191, and FET 190 essentially acts as a pull-down device for node 191. The trip-point voltage $V_{5/12}$ for the 5 v/12 v VPP level detector 55 occurs when the voltage at node 191 is approximately equal to one-half VCC. When node 191 is charged to the trip-point voltage $V_{5/12}$, both FETs 155 and 190 are saturated, and the gate-source voltages and the drain-source currents of FETs 155 and 190 are approximately equal. The trip-point voltage $V_{5/12}$ may approximated using the following equation:

$$V_{5/12} = c \left( \frac{\sqrt{\beta_{155}} \, V_{T155} - \sqrt{\beta_{190}} \, V_{T190}}{\sqrt{\beta_{155}} - \sqrt{\beta_{190}}} \right),$$

wherein c is a constant determined by the common gate-source voltage applied to FETs 155 and 190; $V_{T155}$ is the threshold voltage for FET 155; $V_{T190}$ is the threshold voltage for FET 190; $\beta_{155}$ is the beta value for FET 155; and $\beta 190$ is the beta value for FET 190. For the circuit shown in FIG. 12, c is equal to four.

The beta values for FETs 155 and 190 may be expressed by the following equations:

$$\beta_{155} = k_{155} \frac{w_{155}}{l_{155}}, \text{ and}$$

$$\beta_{190} = k_{190} \frac{w_{190}}{l_{190}},$$

wherein $w_{155}$ is the channel width for FET 155, $l_{155}$ is the channel length for FET 155, $w_{190}$ is the channel width for FET 190, and $l_{190}$ is the channel length for FET 190. The trip-point voltage $V_{5/12}$ may be set by varying the threshold voltages and beta values of the FETs 155 and 190, and by changing the gate-source voltage applied to FETs 155 and 190.

A number of the devices shown in FIG. 12 are provided to protect against the occurrence of certain conditions for the circuit. For example, it is undesirable for node 192 to float at an intermediate voltage because inverter 220 may respond to such an intermediate voltage by drawing DC current. Thus, FETs 215 and 180 are provided to better ensure that node 192 is set at either a high or a low logic level. FET 215 sets node 192 to VCC if VPP is less than VCC by the threshold voltage of FET 215. FET 180 is provided to set node 156 to VPP when the supply voltage VPP is at a relatively low voltage. This results in the gate source voltage of FETs 190 and 195 being set to one-third VPP such that FETs 190 and 195 are switched on earlier. Node 191 is therefore set to system ground, and node 192 is set to VCC. FET 180 thus guards against the case wherein VCC and VPP are approximately the same voltage such that FET 215 does not switch on. When VPP is increased, FET 180 is essentially an open circuit such that all current flows through the voltaged divider circuit and node 156 is set to three-fourths VPP.

During normal operation, once the programming supply voltage VPP has increased enough such that the voltage at node 158 exceeds the threshold voltage of FET 190 and 195, FETs 190 and 195 are switched on. As described above, the FETs 190 and 195 are matched such that they have the same threshold voltage. Node 193 is no longer floating, and FET 185 is switched on. When first switched on, FETs 190 and 185 are operating in the linear region and appear as a low resistance load to FET 155, and the voltage at node 191 is pulled down to system ground VSS. As VPP continues to increase, the gate-source voltage of FET 185 increases, the drain-source current of FET 155 increases, and the equivalent resistance presented to the source of FET 155 by the FETs 185 and 190 increases.

If the programming supply voltage VPP rises beyond 5.0 volts, the trip-point voltage of the 5 v/12 v VPP level detector 55 is approached. When the programming supply voltage VPP is equal to the trip-point voltage $V_{5/12}$ of the 5 v/12 v VPP level detector 55, the equivalent resistance of the FETs 185 and 190 and the drain-source current of the FET 155 have increased such that the node 191 begins to be pulled up to the programming supply voltage VPP. When the voltage at node 191 is greater than the threshold voltage of FET 205, the voltage at node 192 pulled down to system ground VSS, which causes the control signal PD5VPP to be set at a logic low level.

The equivalent resistance of the FETs 185 and 190 is very high, much higher than the resistance that typically can be achieved with a resistor using the same amount of semiconductor die space. As the resistance presented by FETs 185 and 190 is higher than the resistance of the resistor 160 used in the circuit of FIG. 11, the amount of current required by the circuit of FIG. 12 is reduced when compared to the current consumption of the circuit of FIG. 11. The gain of the circuit is increased such that voltage at node 192 can swing between VSS and VPP much more quickly than the circuit shown in FIG. 11.

Internal power supplies

Figure 13A:
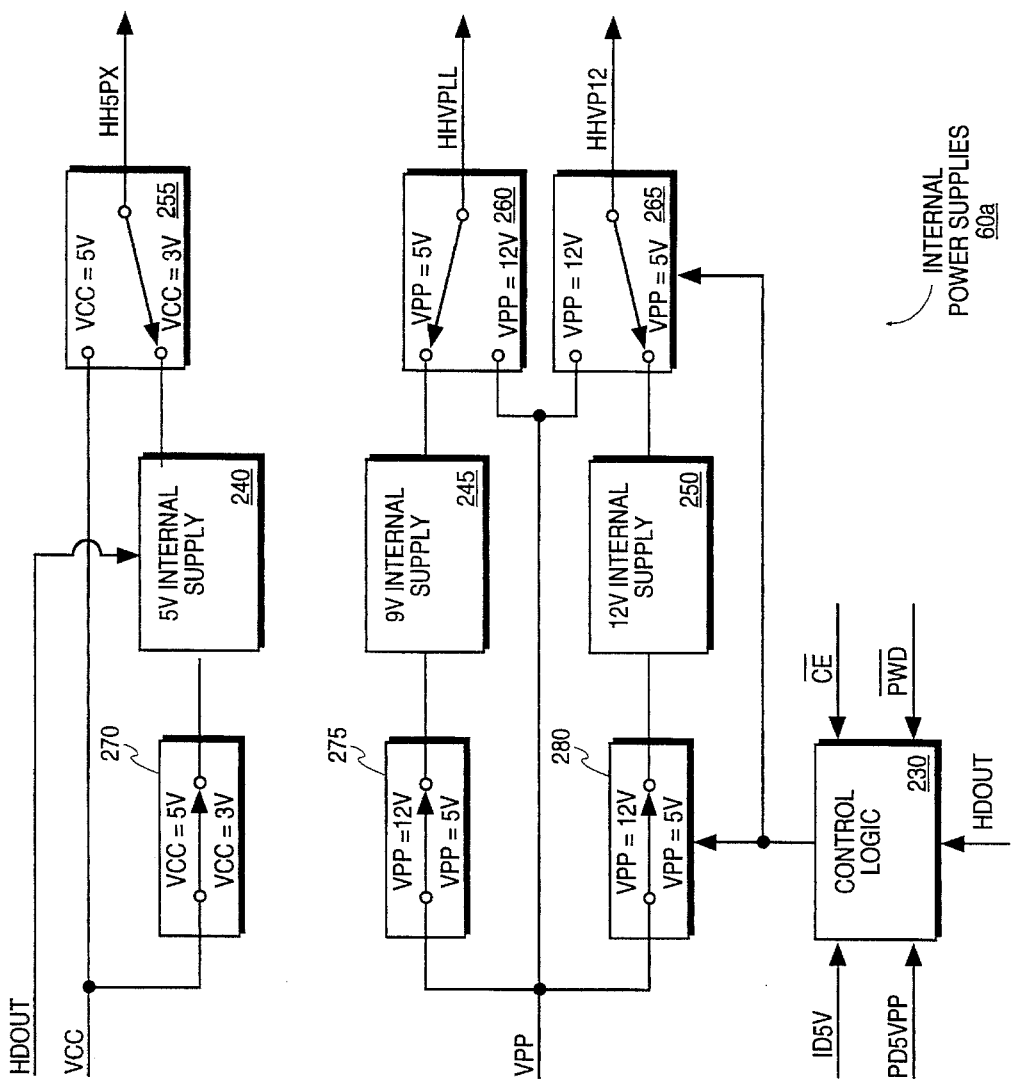
FIGS. 13A and 13B show internal power supplies according to different embodiments.
Figure 13B:
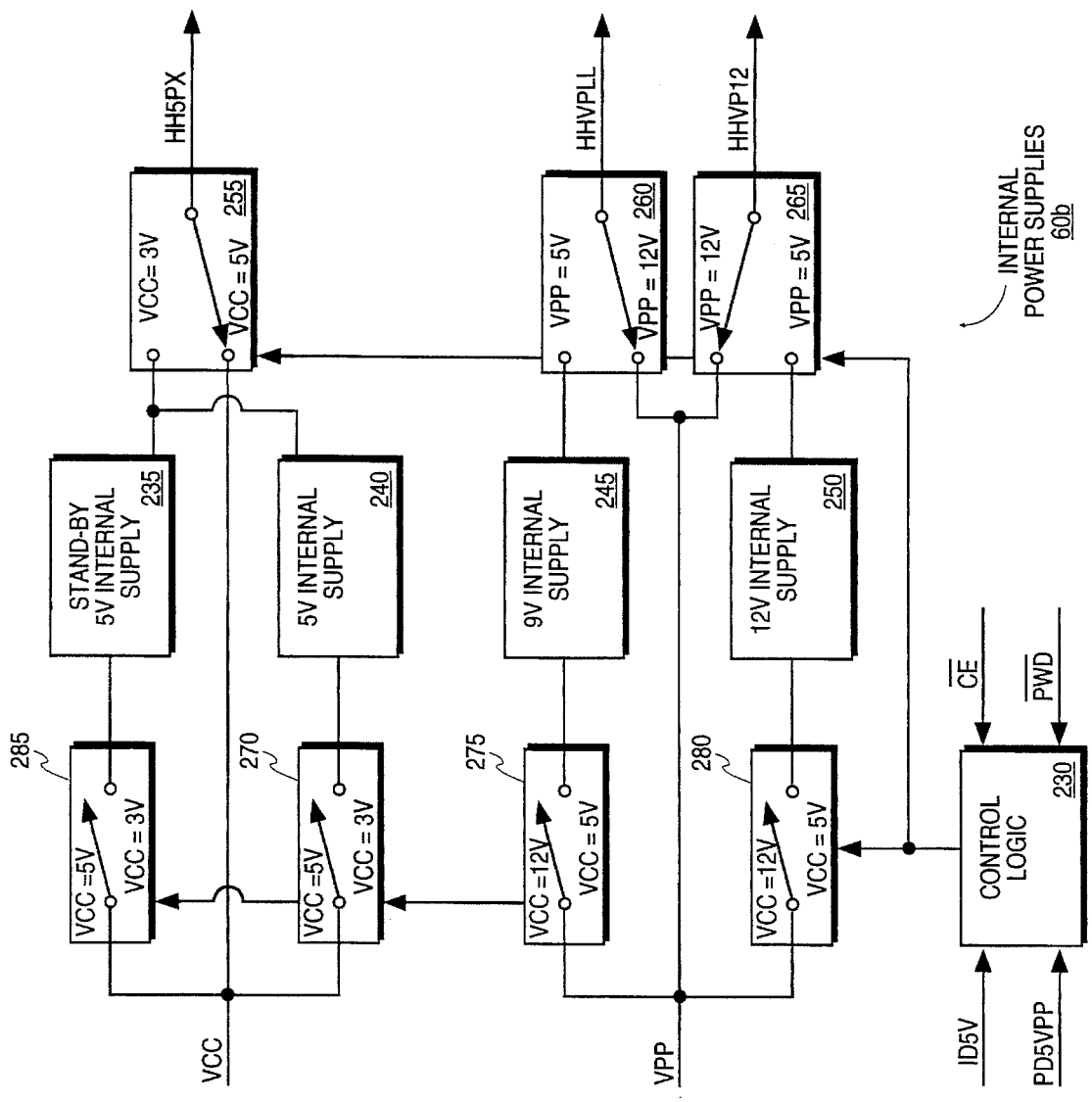

FIG. 13a and 13b show the internal power supplies 60 according to different embodiments. The internal power supplies 60a shown in FIG. 13A may be those for the smart voltage circuitry 27al shown in FIG. 3A. The internal power supplies 60b shown in FIG. 13B may be those for the smart voltage circuitry 27b shown in FIG. 3B.

As shown in FIG. 13A, the internal power supplies 60a may generally include a five volt internal supply 240, a nine volt internal supply 245, and a twelve volt internal supply 250. The internal supplies 240–250 may be enabled to generate the higher voltages required to perform operations on the memory cell array if the external supply voltage levels are too low. The 5 v internal supply 240 is shown as being coupled to receive the control pulse from the pulse generator via the HDOUT signal line so that the wordline switches 23 may be charged to the correct voltage while the flash EEPROM 20 is operating in the stand-by or deep power down modes.

Also included are a plurality of switches 255–280 that are controlled by the control logic 230 to select either the supply voltages or the outputs of the appropriate internal power supplies in response to the detected voltages, the operating mode of the flash EEPROM 20, and the particular operation to be performed. A switch is provided on each side of an internal supply such that the internal supply may be isolated from the remaining circuitry when the internal supply is not selected to provide power to the memory cell array 21. For example, switch 270 is opened and switch 255 selects the external VCC supply pin when external VCC is equal to five volts. Similarly, switches 275 and 280 are open, and switches 260 and 265 select the external VPP supply pin when external VPP is equal to twelve volts. FIG. 13A shows a case wherein external VCC is 3.3 volts, and external VPP is five volts. The use of switches in this manner reduces the amount of current consumed by the internal power supplies 60.

The control logic 230 receives the control signals ID5V and PD5VPP for detecting the values of the operating supply voltage VCC and the programming supply voltage VPP. The control logic 230 is coupled to receive the control signals CE and $\overline{PWD}$ for detecting the mode of operation of the flash EEPROM 20. The control logic 230 is also coupled to receive the control signal HDOUT output by the pulse generator 50. When the flash EEPROM is in the stand-by or deep power down modes, the five volt internal supply 240 is periodically switched on in response to the control signal HDOUT output by the pulse generator 50.

Referring now to FIG. 13B, the internal power supplies 60b may generally include a stand-by five volt internal supply 235, a five volt internal supply 240, a nine volt internal supply 245, and a twelve volt internal supply 250. Also included are a plurality of switches 255–285 that are controlled by the control logic 230 to select either the supply voltages or the outputs of the appropriate internal power supplies in response to the detected voltages, the operating mode of the flash EEPROM 20, and the particular operation to be performed. A switch 285 is provided between the external VCC supply pin and the stand-by internal supply 235.

Figure 14:
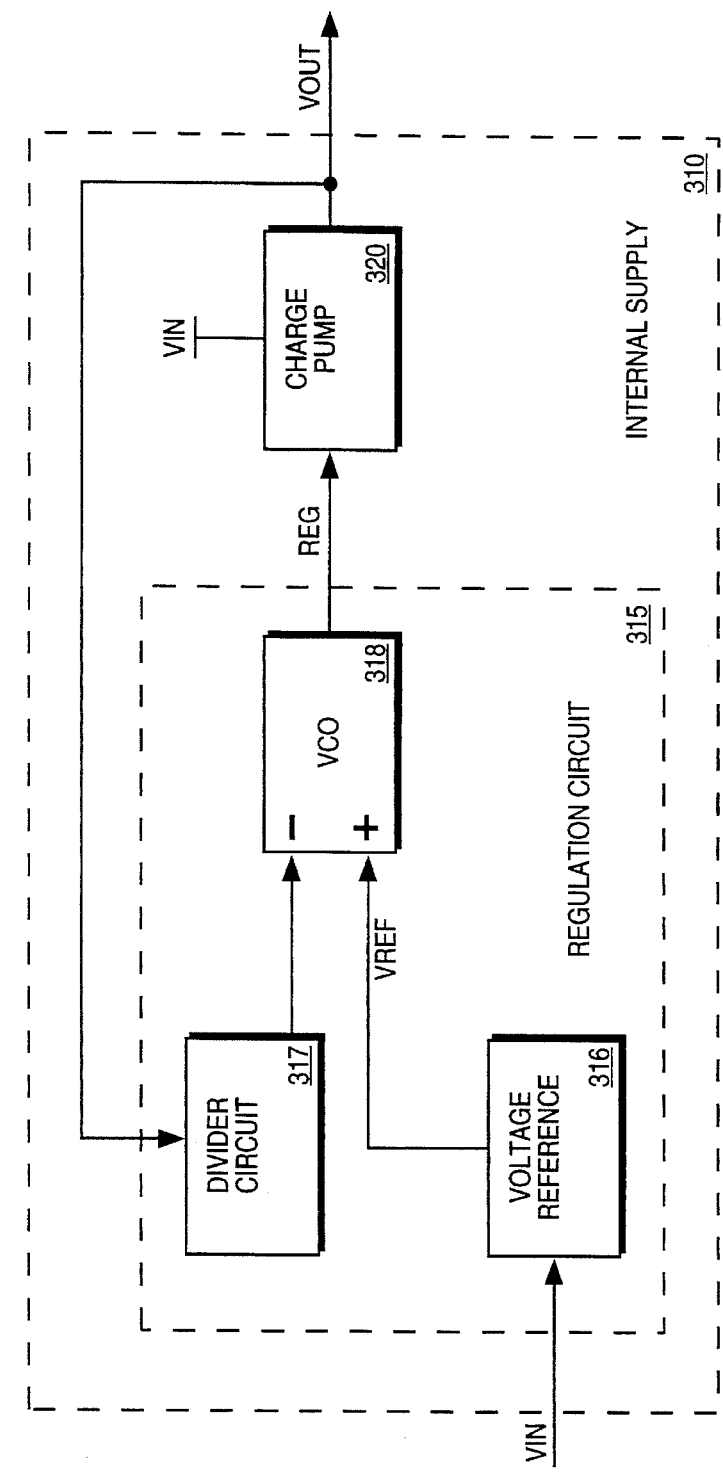
FIG. 14 shows an internal power supply as including regulation circuitry and a charge pump.

The control logic 230 receives the control signals ID5V and PD5VPP for detecting the values of the operating supply voltage VCC and the programming supply voltage VPP. The control logic 230 is coupled to receive the control signals CE and $\overline{PWD}$ for detecting the mode of operation of the flash EEPROM 20. When the flash EEPROM is in the stand-by mode, the stand-by five volt internal supply 235 is enabled to charge the wordline switches to five volts if external VCC is 3.3 volts.

Wherein the internal power supplies 60a and 60b shown in FIGS. 13A and 13B are sufficient, four separate internal supply circuits require large amounts of semiconductor die space. FIG. 14 shows a general internal supply circuit 310 that includes regulation circuitry 315 and a bootstrap charge pump 320. The charge pump 320 is a typically two-stage or a three-stage circuit, but may alternatively include as many stages as required to provide the desired output voltage.

As shown, the regulation circuit 315 includes a voltage reference circuit 316, a divider circuit 317 and a voltage-controlled oscillator ("VCO") 318. The voltage reference 316 is coupled to the input voltage $V_{in}$, which may be the operating supply voltage VCC or the programming supply voltage VPP. The voltage reference 316 uses the input voltage $V_{in}$ to generate a reference voltage $V_{ref}$ that is supplied to the positive terminal of VCO 318. The negative terminal of VCO 318 is coupled to the output of the internal supply 310 via the divider circuit 317. The VCO 318 compares the reference voltage $V_{ref}$ to the output of the divider circuit 317 and outputs a regulation signal REG to the charge pump 320.

Figures 15, 16:
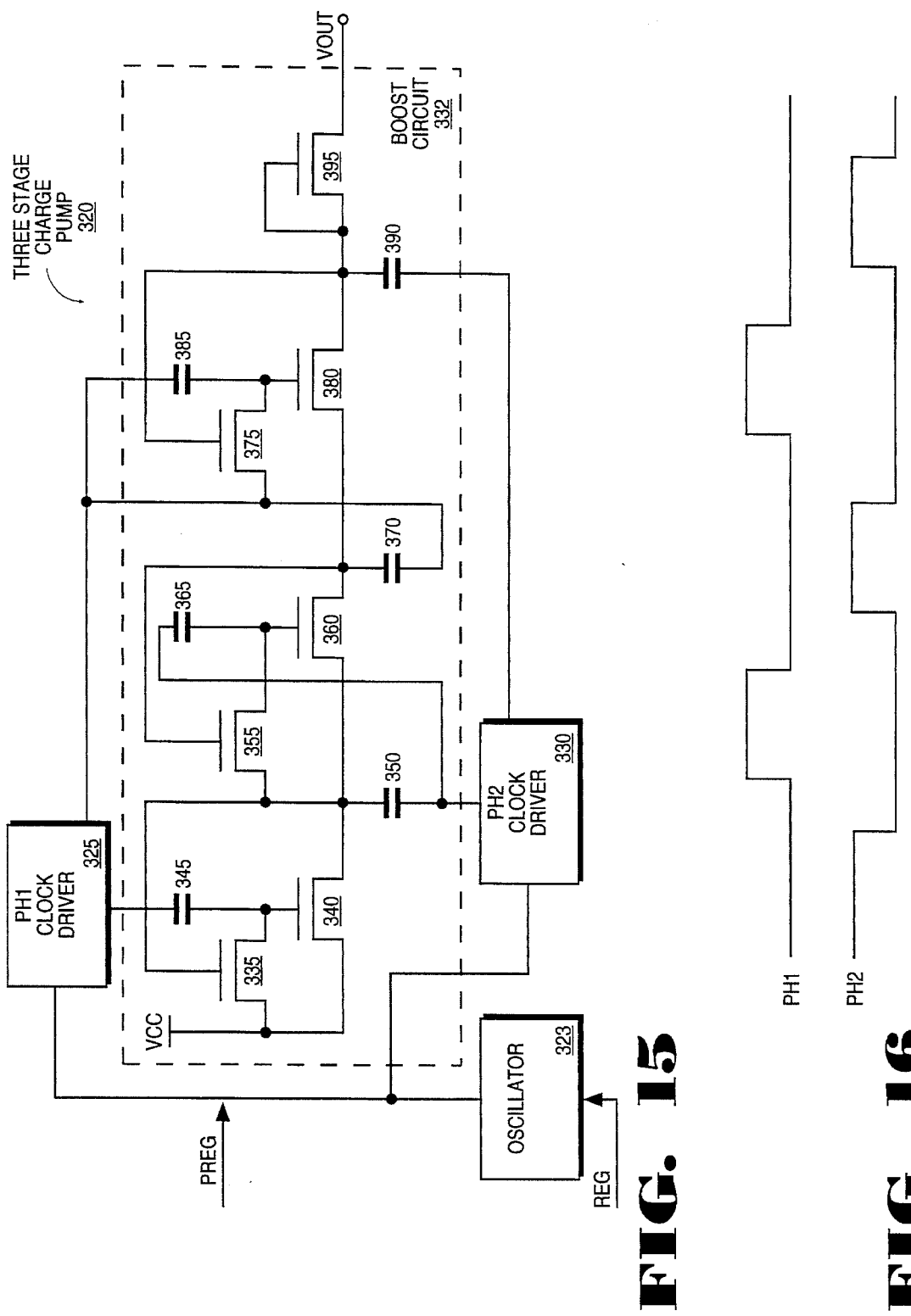
FIG. 15 shows a charge pump in more detail.
FIG. 16 shows clock signals that may be provided to the charge pump of FIG. 15.

FIG. 15 shows a charge pump 320 in more detail. Charge pump 320 is shown as a three-stage charge pump that includes an oscillator 323 coupled to receive the regulation signal REG, a first phase (PH1) clock driver circuit 325, a second phase (PH2) clock driver circuit 330, and a boost circuit 332. The PH1 and PH2 clock driver circuits are coupled to receive a clock signal output by oscillator 323 in response to the regulation signal REG, wherein the PH1 and PH2 clock driver circuits supply different phases of the clock signal to the boost circuit 332. The boost circuit 332 generally comprises the switches and capacitors necessary to boost the input voltage to the desired output voltage. The charging and discharging of the capacitors is controlled by the PH1 and PH2 clock driver circuits. An SBREG signal input is provided between the oscillator 323 and the clock drivers 325 and 330 for receiving a clock signal directly from the stand-by regulation circuitry described in FIG. 19. For alternative embodiments, each of the regulation circuits may include their own clock driver circuits that are multiplexed to control the boost circuit 332.

The boost circuit 332 includes a number of stages of n-channel FETs 340, 360, 380, and 395 connected in series between the input supply $V_{in}$ and the output terminal $V_{out}$. The FETs 340, 360, and 380 are used to switch current from one stage to the next and are therefore called "switching FETs." The two-stage bootstrap charge pump 320 also includes FETs 335, 355, and 375, which are used to control the operation of the switching FETs and are therefore called "control FETs." All of the FETs may be a type of n-channel FET referred to as an "S type device." S type devices are n-channel FETs having a very low threshold voltage level. The use and manufacture of S type devices are described in detail in U.S. Pat. Nos. 4,052,229; 4,096,584; 4,103,189; and 5,057,715.

The clock phase PH1 is provided to the three-stage bootstrap charge pump 320 via capacitors 345, 370, and 385. Switching FETs 340 and 380 and control FET 355 are switched on and off in response to the PH1 clock signal. The clock phase PH2 is provided to the boost circuit 332 via capacitors 350, 365, and 390. Switching FET 360 and control FETs 335 and 375 are switched on and off in response to the PH2 clock signal. The switching FET 395 has its gate coupled to its drain such that it is typically switched on at all times.

Referring to FIG. 16, the two clock phases PH1 and PH2 do not overlap, and the PH2 clock signal is shown as being initially high. When the PH2 clock signal is high, switching FET 360 and control FETs 335 and 375 are all switched on. Initially, the drain and gate of the switching FET 360 are at the same voltage. Because the PH1 clock signal is low, the control FET 355 joining the drain of the switching FET 360 to the gate of switching FET 360 is switched off, and current flows through the switching FET 360. This current transfers charge from the capacitor 350 to the capacitor 370, reducing the drain voltage of the FET 360 such that the switching FET 360 switches completely on, increasing the current furnished to the next stage.

As the voltages at the drain and source of the switching FET 360 begin to equalize, the voltage at the gate of the control FET 355 is raised so the control FET 355 is nearly on. When the PH2 clock signal goes low, the control FET 355 turns on, and the switching FET 360 begins to turn off. Simultaneously, the control FETs 335 and 375 are turned off such that the gate of FET 340 is isolated from the drain of FET 340, and the gate of FET 380 is isolated from the drain of FET 380. When the PH1 clock signal goes high, the control FET 355 switches completely on, equalizing the voltages at the gate and drain of the switching FET 360. Switching FETs 340 and 380 are switched on response to the PH1 clock signal going high.

The switching FETs 340 and 380 function similarly to the switching FET 360 to transfer charge to the capacitors 350 and 390, respectively. Thus, when the PH1 clock signal goes high, the switching FET 340 is switched on and current provided by the input supply $V_{in}$ charges the capacitor 350. Similarly, the switching FET 380 switches on and current provided by the capacitor 370 charges the capacitor 390. The capacitor 350 tends to be charged to twice the input supply voltage $V_{in}$, wherein the capacitor 370 tends to be charged to three times the input supply voltage $V_{in}$, and the capacitor 390 tends to be charged to four times the input supply voltage $V_{in}$. The boost capacitor voltages are provided by the PH1 and PH2 clock signals, which operate to charge the capacitors further. For example, the capacitor 370 is charged to twice $V_{in}$ by the capacitor 350 and to three times $V_{in}$ by the PH1 clock pulse. The maximum output voltage $V_{out}$ of the charge pump 320 is thus approximately equal to the four time the input supply voltage $V_{in}$ less the threshold voltage of the output FET 395. The output voltage $V_{out}$ can be controlled by varying the pulse widths of the clock signals.

The capacitors of the boost circuit 332 and the oscillator 323 typically require large amounts of semiconductor die area, and each internal supply of FIG. 13 includes its own charge pump having an oscillator and boost circuit. Substantially identical circuitry may be used for each charge pump because the circuitry of the charge pump can typically be used for any input supply voltage $V_{in}$. Therefore, to reduce the semiconductor die space required for the internal power supplies 60, the same charge pump can be used for multiple internal power supplies, wherein the appropriate regulation circuitry is multiplexed to control the output voltage of the common charge pump 320.

Figure 17:
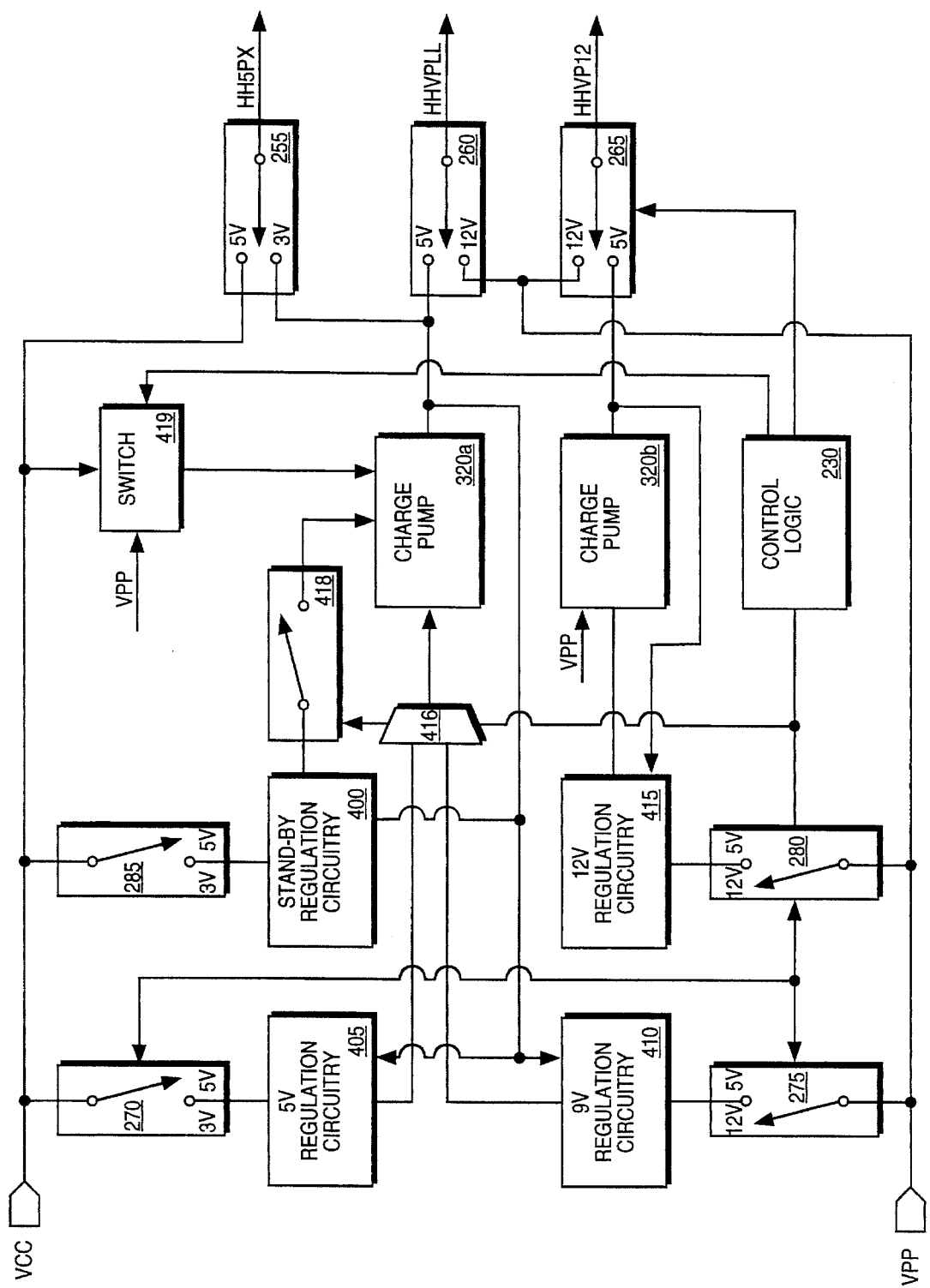
FIG. 17 shows the internal power supplies wherein three charge pump circuits share the same charge pump.

FIG. 17 shows the internal power supplies 60 wherein a common charge pump 320a is shared by the stand-by five volt internal supply, the five volt internal supply, and the nine volt internal supply. The twelve volt internal supply is shown as including a separate charge pump 320b. A multiplexor 416 has a first input coupled to the output of the five volt regulation circuitry 405 and a second input coupled to the output of the nine volt regulation circuitry 410. The output of the multiplexor 416 is coupled to the input of the oscillator for the charge pump 320a. A separate switch 418 is provided between the stand-by regulation circuitry 400 and the clock drivers of the charge pump 320a such that the oscillator of the charge pump 320b is bypassed when the charge pump 320a is used as part of the stand-by five volt internal supply 235.

The control logic 230 is coupled to control the multiplexor 416 and the switch 418, and the control logic 230 determines which of the stand-by regulation circuitry 400, the five volt regulation circuitry 405, and the nine volt regulation circuitry is coupled to the charge pump circuit 320a in response to the operating mode of the flash EEPROM 20 and the current operation being performed on the memory cell array 21. The switches 255–285 are operated as discussed above. Switch 419 is provided to supply either external VCC or VPP to the charge pump 320a. Charge pump 320b is supplied with external VPP.

Figure 18:
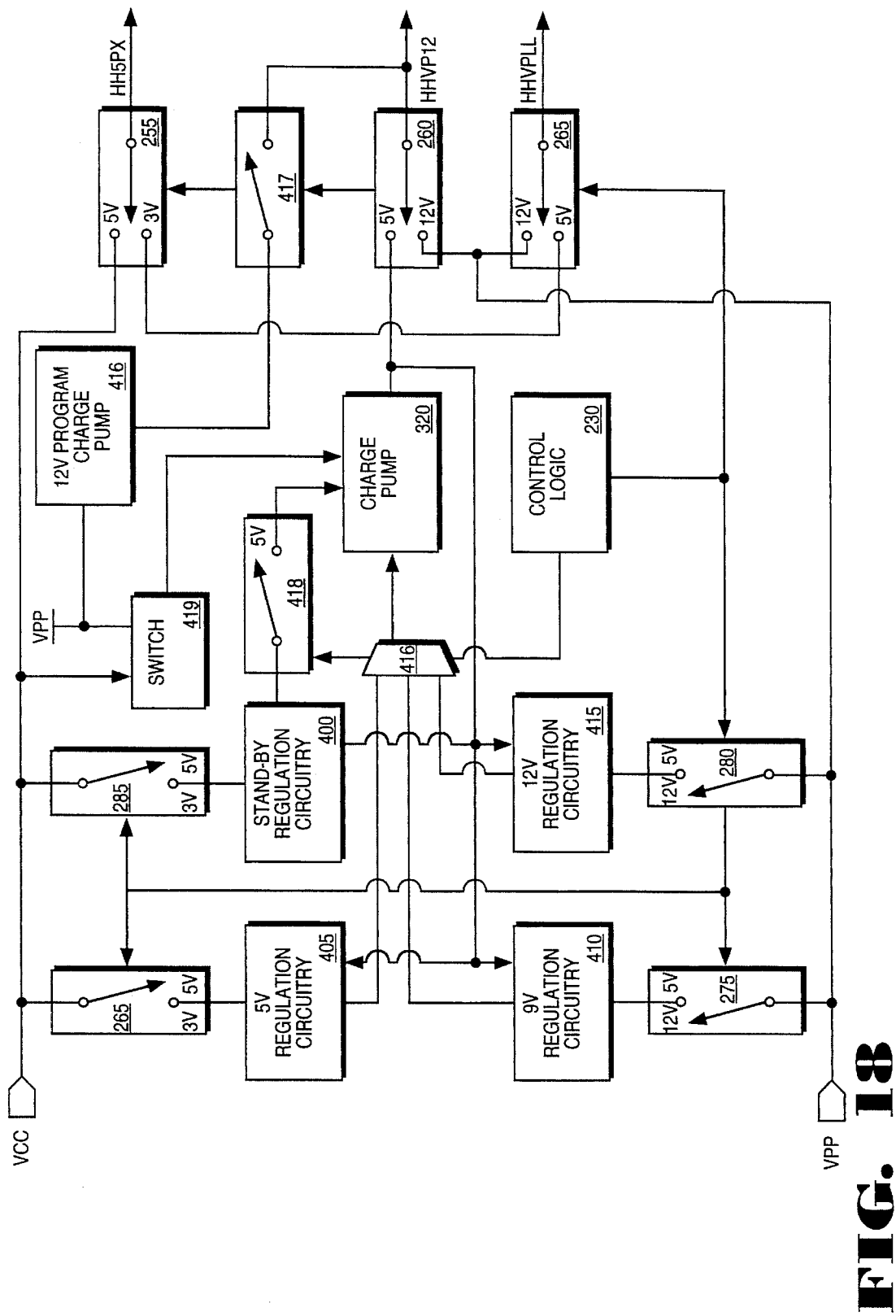
FIG. 18 shows the internal power supplies wherein four charge pump circuits share the same charge pump.

Further reduction of the size of the internal power supplies 60 may be achieved by recognizing that a large charge pump is not required to supply twelve volts during programming. Thus, as shown in FIG. 18, a small twelve-volt programming charge pump 416 may be used during programming operations, such that a single charge pump circuit 320 may be shared to generate the five volt read voltage, the nine volt program voltage, and the twelve volt erase voltage. This reduces the overall size of the internal power supply circuits. An additional switch 417 is provided between the output of the program charge pump 416 and HHVP12. For this embodiment, the multiplexor includes a third input coupled to the output of the twelve volt regulation circuitry 415.

Stand-by Regulation Circuitry

Figure 19:
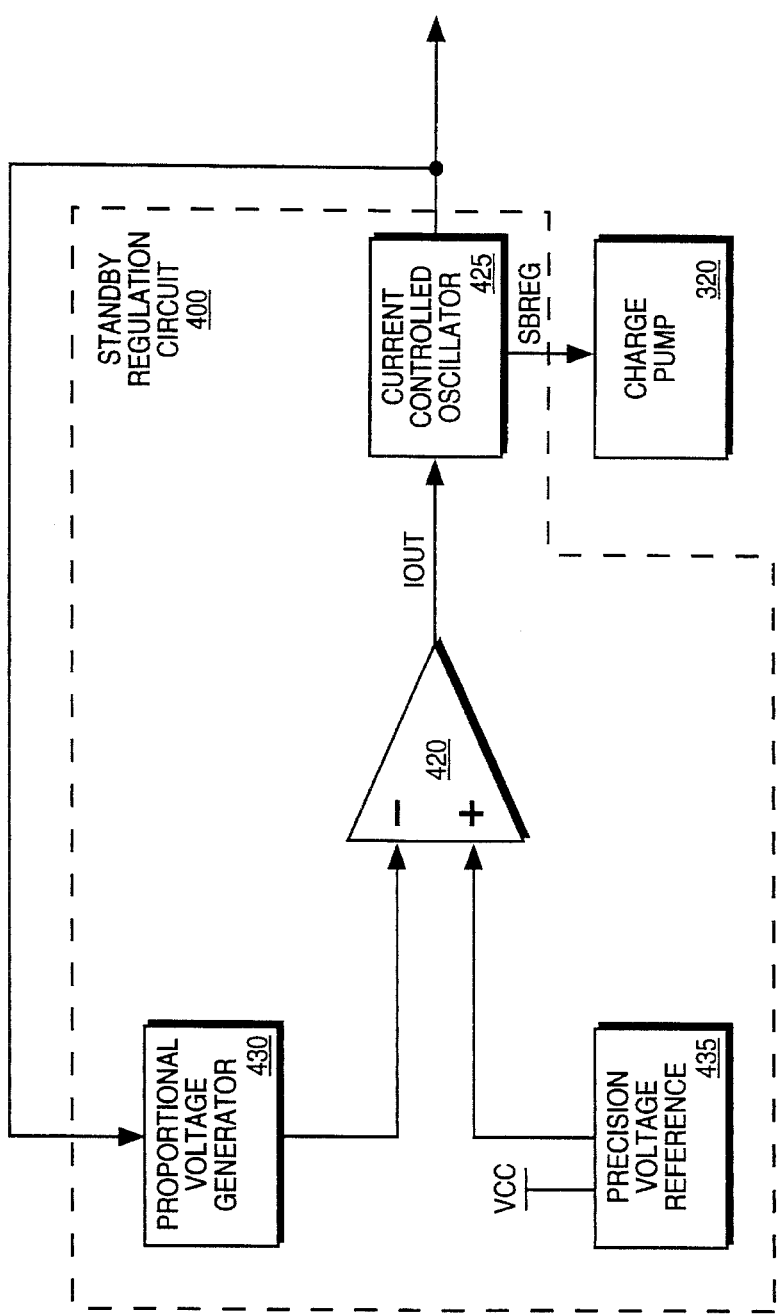
FIG. 19 shows the regulation circuitry of a stand-by charge pump.

FIG. 19 shows stand-by regulation circuitry 400 for controlling the five volt charge pump during stand-by and deep power down modes. As described above with respect of FIG. 3B, if the operating supply voltage VCC is 3.3 volts and the flash EEPROM 20 is in the stand-by operating modes, the stand-by five-volt internal supply is enabled to maintain the voltage of the wordline switches at 5 volts.

The stand-by regulation circuitry 400 includes a transconductance operational amplifier 420, proportional voltage generator 430, a voltage reference 435, and a current controlled oscillator 425. The operational amplifier 420 outputs a current $I_{out}$ that is proportional to the difference in voltages detected at the positive and negative input terminals. The current controlled oscillator outputs the SBREG signal in response to the current $I_{out}$, and SBREG is drives the clock drivers of the charge pump 320.

The positive input terminal of op-amp 420 is coupled to the output of the voltage reference circuit 435, which may be manufactured according to the teachings of U.S. Pat. No. 5,339,272, entitled *Precision Voltage Reference*, issued of Kerry Tedrow et al., and commonly assigned to Intel Corporation of Santa Clara, Calif. The negative input terminal of op-amp 420 is coupled to the output of a proportional voltage generator 430 having its input coupled to the output of the charge pump 320, which is coupled to the wordline switches 23. The op-amp 420 compares the voltages at its terminals and outputs a current $I_{out}$ in response to the comparison, and the current controlled oscillator 425 varies the frequency of SBREG in response to the amount of current $I_{out}$ received from the operational amplifier 420.

The Pulse Generator

Figure 20:
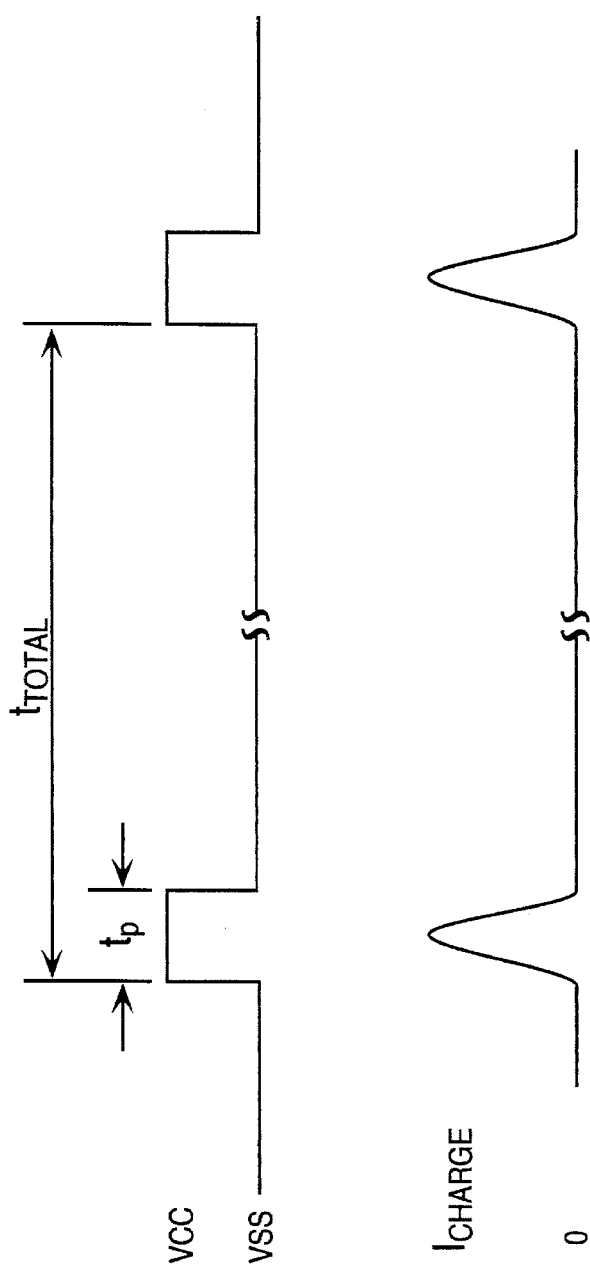
FIG. 20 shows the output of the pulse generator and the corresponding current consumption of a charge pump enabled in response to a pulse generated by the pulse generator.

As described above with respect to FIG. 3A, the internal power supplies 60a of smart voltage circuitry 27a are periodically enabled to charge the wordline switches 23 to five volts when the flash EEPROM 20 is not in the active mode and external VCC is 3.3 volts. FIG. 20 shows the output of the pulse generator 50 as a function of time. As described above, the five-volt internal power supply is enabled for a single pulse of duration $t_p$ once every $t_{total}$ seconds. A current $I_{charge}$ is consumed by the five volt internal supply for the duration of a pulse, after which the current $I_{charge}$ falls to zero. The amount of current $I_{charge}$ consumed at any given pulse is determined by the amount of charging required to charge the wordline switches 23 back up to 5.0 volts. The time $t_{total}$ is chosen in view of the RC time constant for the wordline switches 23, the maximum allowable voltage drop on the wordline switches 23, and a worst case leakage current for the memory cell array 21. The time $t_p$ is chosen in view of the RC time constant for the wordline switches 23 and the amount of current that the five-volt internal power supply can source. The pulse generator is designed to supply a pulse having the duration $t_p$ once every $t_{total}$ seconds.

Figure 21:
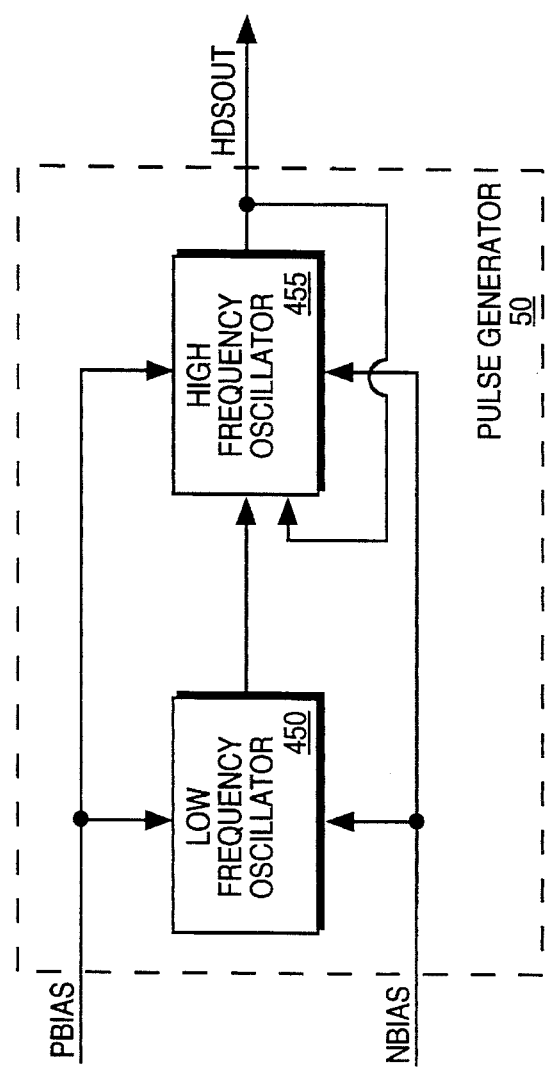
FIG. 21 shows the pulse generator circuit in more detail.

Because the pulse generator 50 is designed to operate when the flash EEPROM 20 is in either the stand-by or deep power down modes of operation, the pulse generator 50 should consume as little current as possible so that the power consumption of the flash EEPROM 20 does not exceed the maximum power consumption for the stand-by and deep power down modes. FIG. 21 shows the pulse generator 50 in block diagram form. The pulse generator 50 generally includes a low frequency oscillator circuit 450 and a high frequency oscillator circuit 455. Both the low frequency oscillator circuit 450 and the high frequency oscillator circuit 455 are coupled to receive the biasing signals PBIAS and NBIAS from the current source circuit 45. For one embodiment, PBIAS and NBIAS each provide 40 nanoamperes of current.

The high frequency oscillator 455 is coupled to receive the output signal of the low frequency oscillator circuit 450. The high frequency oscillator 455 is also feedback connected to its own output such that the high frequency oscillator 455 outputs a pulse having the duration of one-half the period for the high frequency oscillator 455 once every period for the low frequency oscillator 450. For example, wherein the period of the low frequency oscillator 450 is equal to three milliseconds and the period of the high frequency oscillator 455 is equal to twelve microseconds, the high frequency oscillator 455 outputs a pulse having a six microsecond duration once every three milliseconds.

FIG. 22 shows the low frequency oscillator circuit 450 in more detail. The low frequency oscillator circuit 450 is shown as a ring oscillator circuit comprising an odd number of inverters 460–510 coupled in a feedback configuration. Specifically, inverters 460–510 are coupled in series, and the output of inverter 510 is fed back as the input of inverter 460. There may be more or less inverters, depending on the desired frequency of oscillation.

The output of the low frequency oscillator circuit 450 is the output of the inverter 485. The positive rail of each inverter is coupled to the operating supply voltage VCC via a corresponding pair of p-channel FETs 515 and 520. The gate of each FET 515 is coupled to receive the PBIAS signal, which biases the FET 515 to act as weak pull-up devices. Thus, the positive rails of the inverters are charged slowly and require little current. The FETs 520 act as cascode devices that isolate the positive rails of the inverters from the operating supply voltage VCC when the voltage at the gate of the FET 520 is logic high. Each of the FETs 520 is controlled independently of the other FETs 520. Generally, the gates of the FETs 520 are controlled by the output of the inverter that is one more than one-half the total number of inverters down the chain from the output of the corresponding inverter. For example, the FET 520 coupled to the inverter 460 has its gate voltage controlled by the output of inverter 490, wherein the FET 520 coupled to the inverter 465 has its gate voltage controlled by the output of inverter 495.

The negative rails of the inverters 460–510 are similarly coupled to system ground VSS via n-channel FETs 525 and 530. The gates of FETs 525 are all coupled to the NBIAS signal such that the FETs 525 operate as weak pull-down devices. Each of the FETs 530 is controlled independently of the other FETs 530. Generally, the gates of the FETs 530 are controlled by the output of the inverter that is one more than one-half the total number of inverters down the chain from the output of the corresponding inverter. For example, the FET 530 coupled to the inverter 460 has its gate voltage controlled by the output of inverter 490, wherein the FET 530 coupled to the inverter 465 has its gate voltage controlled by the output of inverter 495.

One advantage of biasing the pull-up and pull-down devices (FETs 515 and 525) of the oscillators to be in the subthreshold region is that the frequency of the oscillators tends to increase with temperature. This should be contrasted with pull-up and pull-down devices that are biased to operate in the saturated region, wherein the frequency of the oscillator tends to decrease with temperature. The leakage current of the wordline switches 23 also tends to increase with temperature, and the increased frequency of the oscillators allows the wordline switches 23 to be maintained at approximately five volts.

The cascode devices 520 and 530 coupled to the rails of each inverter help to ensure that no conduction path is provided between VCC and VSS. Wherein it is possible that the p-channel and n-channel FETs (not shown) of the inverters may be switched on simultaneously for a short period of time when the inverter transitions from one state to another, the cascode devices 520 and 530 effectively eliminate any conduction path between VCC and VSS because either VCC or VSS is decoupled from the inverter. It is also possible for the cascode devices 520 and 530 to be switched on simultaneously when the output of the controlling inverter transitions from one state to another; however, the inverter for which the FETs 520 and 530 act as cascode devices is in the steady state such that no conduction path between VCC and VSS arises.

The period of a ring oscillator is equal to the twice the product of the total number of inverters and the propagation delay for an inverter. For one embodiment, the low frequency oscillator 450 is selected to have a period of three milliseconds.

Returning to FIG. 21, the output of the low frequency oscillator 450 is provided to enable the high frequency oscillator 455. The high frequency oscillator 455 may be a ring oscillator similar to that shown in FIG. 22, wherein the period is defined to be much smaller than that of the low frequency oscillator 455. The period of the high frequency oscillator 455 may be, for example, twelve microseconds. The high frequency oscillator 455 is enabled to begin operation when the output of the low frequency oscillator 450 goes high. The output of the high frequency oscillator 455 is fed back to the input of the high frequency oscillator 455 so that the high frequency oscillator 455 may be disabled when the output of the high frequency oscillator 455 goes low. In this manner, a single pulse having a duration of half the period of the small period oscillator is generated at the once every large period.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. A voltage detector circuit for detecting when an input voltage exceeds a trip-point voltage, comprising:

a nonvolatile memory cell including a select gate coupled to the input voltage, a drain coupled to a first node, a source coupled to a first voltage, and a floating gate, wherein the nonvolatile memory cell has a programmable threshold voltage and the threshold voltage is programmed such that the nonvolatile memory cell is switched on to set the first node to the first voltage if the input voltage exceeds the trip-point voltage; and a first transistor including a control electrode coupled to a biasing voltage, a first terminal coupled to the first node, and a second terminal coupled to the input voltage, the control electrode for coupling the first terminal to the second terminal in response to the biasing voltage, wherein the first transistor sets the first node to the input voltage if the input voltage is less than the trip-point voltage; and an output circuit coupled to the first node, the output circuit being operative to indicate whether the input voltage exceeds the trip-point voltage in response to the voltage of the first node.

2. The voltage detector circuit of claim 1, wherein the output circuit comprises an inverter having an input coupled to the first node.

3. The voltage detector circuit of claim 2, wherein the inverter is powered by the input voltage.

4. The voltage detector circuit of claim 2, wherein an output of the inverter is coupled to the gate of the first transistor such that the first transistor is switched off when the voltage of the first node is at the first voltage.

5. The voltage detector circuit of claim 2, wherein the nonvolatile memory cell is a flash electrically erasable programmable read only memory.

6. The voltage detector circuit of claim 5, further comprising a second transistor coupled between the nonvolatile memory cell and the first node such that a first terminal of the second transistor is coupled to the drain of nonvolatile memory cell and a second terminal of the second transistor is coupled to the first node, wherein a voltage is applied to a control electrode of the second transistor such that a voltage at the drain of the nonvolatile memory cell is limited to a predetermined maximum value.

7. The voltage detector circuit of claim 6, further comprising a third transistor coupled between the supply voltage and the first transistor such that a first terminal of the third transistor is coupled to the second terminal of the first transistor and a second terminal of the third transistor is coupled to the supply voltage; and a feedback control circuit coupled to an output of the inverter and the control electrode of the third transistor, the feedback control circuit being operative to supply the output of the inverter to the control electrode of the third transistor when the voltage detector is operating in a first mode and being operative to supply a constant voltage to the control electrode of the third transistor such that the third transistor is switched on when the voltage detector circuit is operating in a second mode.

8. A nonvolatile memory device comprising:

a conductor for coupling to receive an input voltage;

a memory cell array comprising a plurality of nonvolatile memory cells arranged in a matrix of rows and columns, wherein the memory cell array is coupled to receive the input voltage;

a voltage detector circuit coupled to the conductor for detecting whether the input voltage exceeds a trip-point voltage, the voltage detector circuit comprising:

a nonvolatile memory cell including a select gate coupled to the input voltage, a drain coupled to a first node, a source coupled to system ground, and a floating gate, wherein the nonvolatile memory cell has a programmable threshold voltage and the threshold voltage is programmed such that the nonvolatile memory cell is switched on to set the first node to system ground if the input voltage exceeds the trip-point voltage;

a first transistor including a control electrode coupled to a biasing voltage, a first terminal coupled to the first node, and a second terminal coupled to the input voltage, the control electrode for coupling the first terminal to the second terminal in response to the biasing voltage;

an inverter having an input coupled to the first node and an output for indicating whether the input voltage exceeds the trip-point voltage; and a control circuit coupled to the output of the inverter and the control electrode of the first transistor, the control circuit for supplying the output of the inverter to the control electrode of the first transistor as the biasing voltage when power is first applied to the nonvolatile memory device such that the first transistor is switched off when the output of the inverter indicates that the input voltage exceeds the trip-point voltage, and for supplying the biasing voltage to the control electrode of the first transistor when erase and program operations are performed on the memory cell array such that the first transistor is switched on continuously.

9. A nonvolatile memory device comprising:

a conductor for coupling to receive an input voltage;

a memory cell array comprising a plurality of nonvolatile memory cells arranged in a matrix of rows and columns, wherein the memory cell array is coupled to receive the input voltage;

a voltage detector circuit coupled to the conductor for detecting whether the input voltage exceeds a trip-point voltage, the voltage detector circuit comprising:

a nonvolatile memory cell including a select gate coupled to the input voltage, a drain coupled to a first node, a source coupled to system ground, and a floating gate, wherein the nonvolatile memory cell has a programmable threshold voltage and the threshold voltage is programmed such that the nonvolatile memory cell is switched on to set the first node to system ground if the input voltage exceeds the trip-point voltage;

an inverter having an input coupled to the first node and an output, the inverter for indicating that the input voltage is less than the trip-point voltage by setting the output to system ground and for indicating that the input voltage is at least the trip-point voltage by setting the output to the input voltage; and a first transistor including a control electrode coupled to a biasing voltage, a first terminal coupled to the first node, and a second terminal coupled to the input voltage, the control electrode for coupling the first terminal to the second terminal in response to the biasing voltage, wherein the first transistor sets the first node to the input voltage if the input voltage is less than the trip-point voltage.

10. A nonvolatile memory device comprising:

a conductor for coupling to receive an input voltage;

a memory cell array comprising a plurality of nonvolatile memory cells arranged in a matrix of rows and columns, wherein the memory cell array is coupled to receive the input voltage;

a voltage detector circuit coupled to the conductor for detecting whether the input voltage exceeds a trip-point voltage, the voltage detector circuit comprising:

a nonvolatile memory cell including a select gate coupled to the input voltage, a drain coupled to a first node, a source coupled to system ground, and a floating gate, wherein the nonvolatile memory cell has a programmable threshold voltage and the threshold voltage is programmed such that the nonvolatile memory cell is switched on to set the first node to system ground if the input voltage exceeds the trip-point voltage;

a first transistor including a control electrode coupled to a biasing voltage, a first terminal coupled to the first node, and a second terminal coupled to the input voltage, the control electrode for coupling the first terminal to the second terminal in response to the biasing voltage, wherein the first transistor is switched on continuously for setting the first node to the input voltage if the input voltage is less than the trip-point voltage; and an inverter having an input coupled to the first node and an output for indicating whether the input voltage exceeds the trip-point voltage.

11. A method for indicating whether an input voltage exceeds a trip-point voltage:

applying the input voltage to a gate of a nonvolatile memory cell having a threshold voltage programmed to be the trip-point voltage, wherein the nonvolatile memory cell includes a drain coupled to a first node and a source coupled to system ground; p1 detecting that a voltage of the first node is set to a supply voltage if the nonvolatile memory cell is switched off in response to the input voltage being less than the trip-point voltage;

indicating that the input voltage is less than the trip-point voltage if the voltage of the first node is set to the supply voltage;

detecting that a voltage of the first node is set to system ground if the nonvolatile memory cell is switched on in response to the input voltage exceeding the trip-point voltage; and indicating that the input voltage exceeds the trip-point voltage if the voltage of the first node is set to system ground.

* * * * *

UNITED STATES PATENT AND TRADEMARK OFFICE
CERTIFICATE OF CORRECTION

PATENT NO. : 5,495,453
DATED : February 27, 1996
INVENTOR(S) : Wojciechowski et al.

It is certified that error appears in the above-indentified patent and that said Letters Patent is hereby corrected as shown below:

In the title page at [19] delete "Wjciechowski et al" and insert --Wojiechowski et al.--

In the title page at [75] delete "Wojciechowski" and insert --Wojiechowski--.

In column 1 at line 28 delete "systems being desired" and insert --systems is being designed--

In column 5 at line 10 delete "2.0" and insert --12.0--

In column 13 at line 67 delete "$V_{170}$," and insert --$V_{t70}$,--

In column 18 at line 21 delete "27al" and insert --27a--

UNITED STATES PATENT AND TRADEMARK OFFICE
CERTIFICATE OF CORRECTION

PATENT NO.   : 5,495,453
DATED        : February 27, 1996
INVENTOR(S)  : Wojciechowski et al.

It is certified that error appears in the above-indentified patent and that said Letters Patent is hereby corrected as shown below:

In column 18 at line 58 delete "CE" and insert --$\overline{\text{CE}}$--

In column 19 at line 14 delete "CE" and insert --$\overline{\text{CE}}$--

Signed and Sealed this

First Day of October, 1996

BRUCE LEHMAN

Attest:

*Attesting Officer*                *Commissioner of Patents and Trademarks*